(12) United States Patent
Kim et al.

(10) Patent No.: US 11,502,280 B2
(45) Date of Patent: Nov. 15, 2022

(54) DISPLAY DEVICE

(71) Applicant: Samsung Display Co., LTD., Yongin-si (KR)

(72) Inventors: Seo-Yeon Kim, Hwaseong-si (KR); Youngbin Kim, Cheonan-si (KR); Kwangdeuk Jang, Asan-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 154 days.

(21) Appl. No.: 17/116,149

(22) Filed: Dec. 9, 2020

(65) Prior Publication Data

US 2021/0288282 A1    Sep. 16, 2021

(30) Foreign Application Priority Data

Mar. 16, 2020    (KR) .................. 10-2020-0031779

(51) Int. Cl.
| | |
|---|---|
| *H01L 51/52* | (2006.01) |
| *H01L 27/32* | (2006.01) |
| *H01L 51/00* | (2006.01) |
| *H01L 51/56* | (2006.01) |

(52) U.S. Cl.
CPC .......... *H01L 51/529* (2013.01); *H01L 27/323* (2013.01); *H01L 27/3272* (2013.01); *H01L 27/3276* (2013.01); *H01L 51/0097* (2013.01); *H01L 51/56* (2013.01); *H01L 2227/323* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 8,847,726 B2 | 9/2014 | Ikeda et al. | |
| 9,326,375 B2 * | 4/2016 | Lee | .............. G02F 1/133305 |
| 11,233,208 B2 * | 1/2022 | Dang | .............. H01L 51/0097 |
| 2007/0013056 A1 | 1/2007 | Lee et al. | |
| 2019/0096913 A1 * | 3/2019 | Lee | .............. H01L 27/1218 |
| 2020/0194712 A1 * | 6/2020 | Choi | .............. H01L 51/56 |
| 2021/0175462 A1 * | 6/2021 | Shin | .............. H01L 51/5237 |
| 2021/0407338 A1 * | 12/2021 | Zhu | .............. G09F 9/301 |

FOREIGN PATENT DOCUMENTS

| | | |
|---|---|---|
| KR | 1020050113167 A | 12/2005 |
| KR | 10-0652519 B1 | 12/2006 |
| KR | 1020070062748 A | 6/2007 |
| KR | 10-1348716 B1 | 1/2014 |
| KR | 10-1439398 B1 | 9/2014 |

\* cited by examiner

*Primary Examiner* — J. E. Schoenholtz
(74) *Attorney, Agent, or Firm* — Cantor Colburn LLP

(57) ABSTRACT

A display device includes a display panel including a front surface at which an image is displayed and a rear surface which is opposite to the front surface; a circuit board connected to the display panel and facing the rear surface of the display panel; and a heat dissipation layer between the rear surface of the display panel and the circuit board. The heat dissipation layer includes a first heat dissipation sheet electrically connected to the circuit board and a second heat dissipation sheet spaced apart from the first heat dissipation sheet in a direction along the display panel.

20 Claims, 14 Drawing Sheets

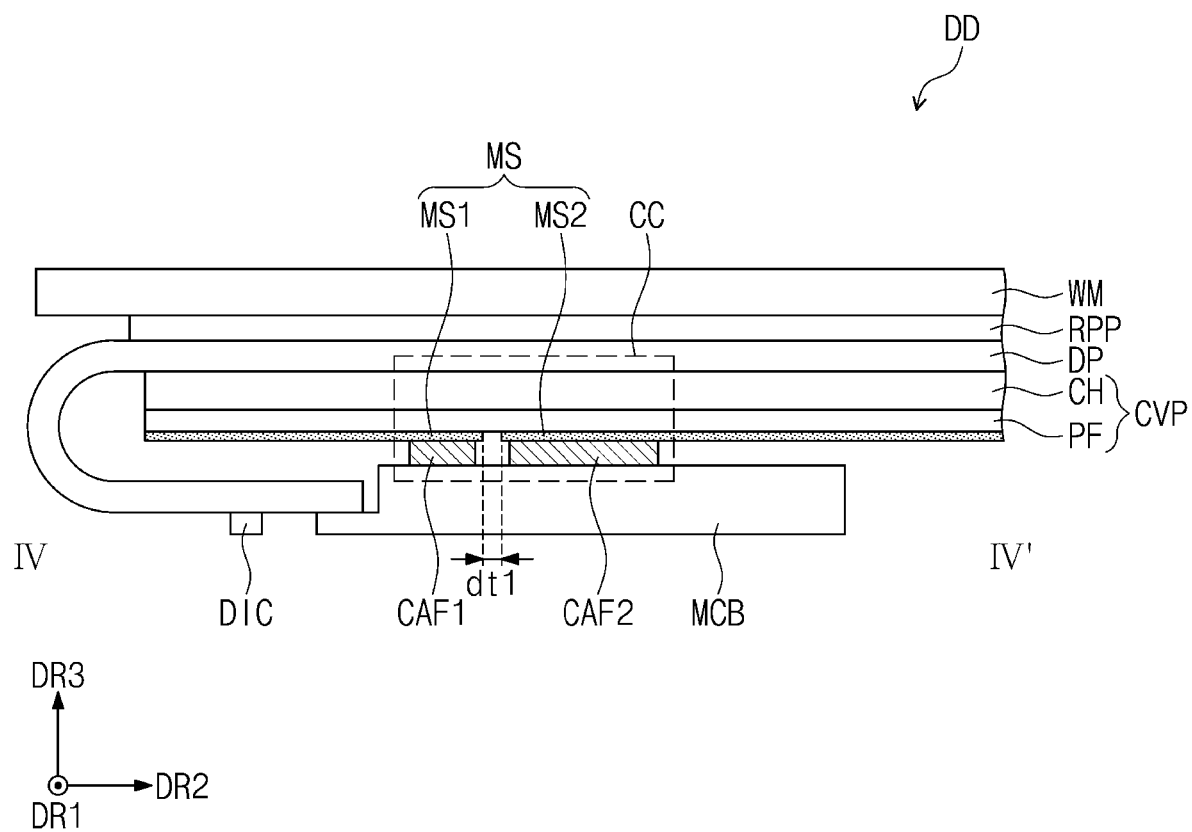

DISPLAY DEVICE

This application claims priority to Korean Patent Application No. 10-2020-0031779, filed on Mar. 16, 2020, and all the benefits accruing therefrom under 35 U.S.C. § 119, the contents of which are hereby incorporated by reference in its entirety.

BACKGROUND

1. Field

The disclosure relates to a display device. More particularly, the disclosure relates to a display device having improved static electricity characteristics.

2. Description of the Related Art

A display panel (hereinafter, referred to as a "flexible display module") that is rollable and/or foldable is being developed. The flexible display module includes a flexible display panel and various functional members. The flexible display panel includes a base member, various functional layers on the base member, and pixels on the base member. A rollable display device or a foldable display device includes the flexible display module.

SUMMARY

The disclosure provides a display device having improved static electricity characteristics.

Embodiments provide a display device including a display panel which displays an image, a circuit board connected to the display panel and facing a rear surface of the display panel, and a heat dissipation layer between the rear surface of the display panel and the circuit board. The heat dissipation layer includes a first heat dissipation sheet electrically connected to the circuit board and a second heat dissipation spaced apart from the first heat dissipation sheet.

According to one or more embodiment, the heat dissipation layer is divided into the first and second heat dissipation sheets spaced apart from each other, and the first heat dissipation sheet is electrically connected to a ground line of the circuit board. Therefore, damage to a driving chip due to static electricity introduced through the second heat dissipation sheet may be reduced or effectively prevented, and the static electricity characteristics of the display device may be improved.

BRIEF DESCRIPTION OF THE DRAWINGS

The above and other advantages of the disclosure will become readily apparent by reference to the following detailed description when considered in conjunction with the accompanying drawings where:

FIG. 7A is a cross-sectional view taken along line IV-IV' shown in FIG. 6A;

DETAILED DESCRIPTION

Figure 1A:
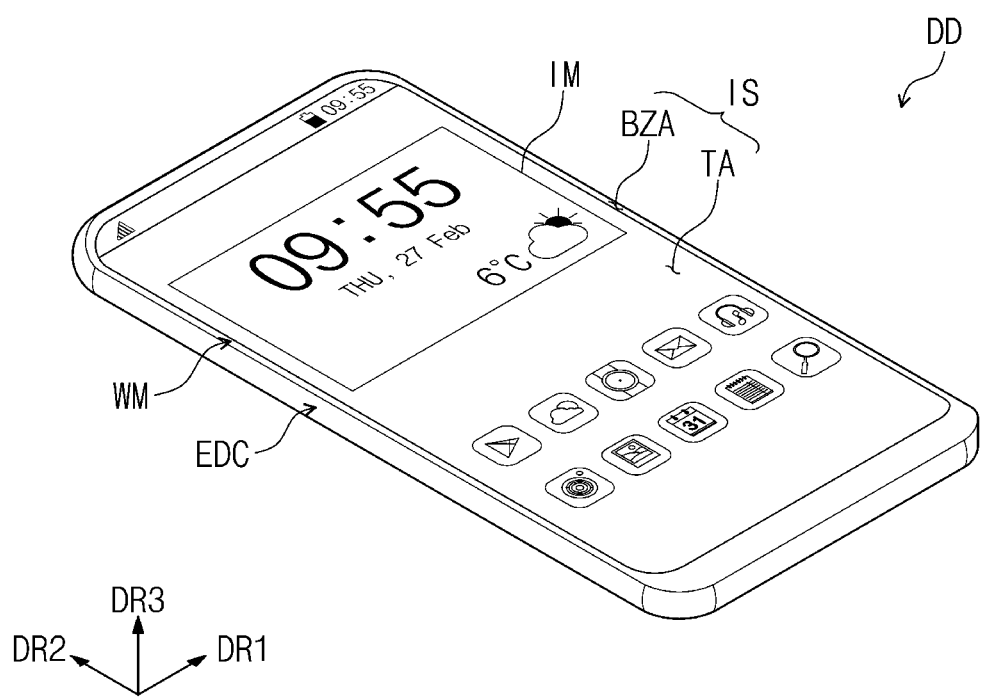
FIG. 1A is a perspective view showing an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being related to another element such as being "on," "connected to" or "coupled to" another element or layer, it can be directly on, connected or coupled to the other element or layer or intervening elements or layers may be present. In contrast, when an element or layer is referred to as being related to another element such as being "directly on," "directly connected to" or "directly coupled to" another element or layer, no other element or layer or intervening elements or layers are present.

Like numerals refer to like elements throughout. In the drawings, the thickness, ratio, and dimension of components are exaggerated for effective description of the technical content.

The terminology used herein is for the purpose of describing particular embodiments only and is not intended to be limiting. As used herein, the term "and/or" includes any and all combinations of one or more of the associated listed items. For example, "an element" has the same meaning as "at least one element," unless the context clearly indicates otherwise. "At least one" is not to be construed as limiting "a" or "an." "Or" means "and/or."

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure.

As used herein, the singular forms, "a," "an" and "the" are intended to include the plural forms as well, unless the context clearly indicates otherwise.

Spatially relative terms, such as "beneath," "below," "lower," "above," "upper" and the like, may be used herein for ease of description to describe one element or feature's relationship to another element(s) or feature(s) as illustrated in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the disclosure will be explained in detail with reference to the accompanying drawings.

Figure 1B:
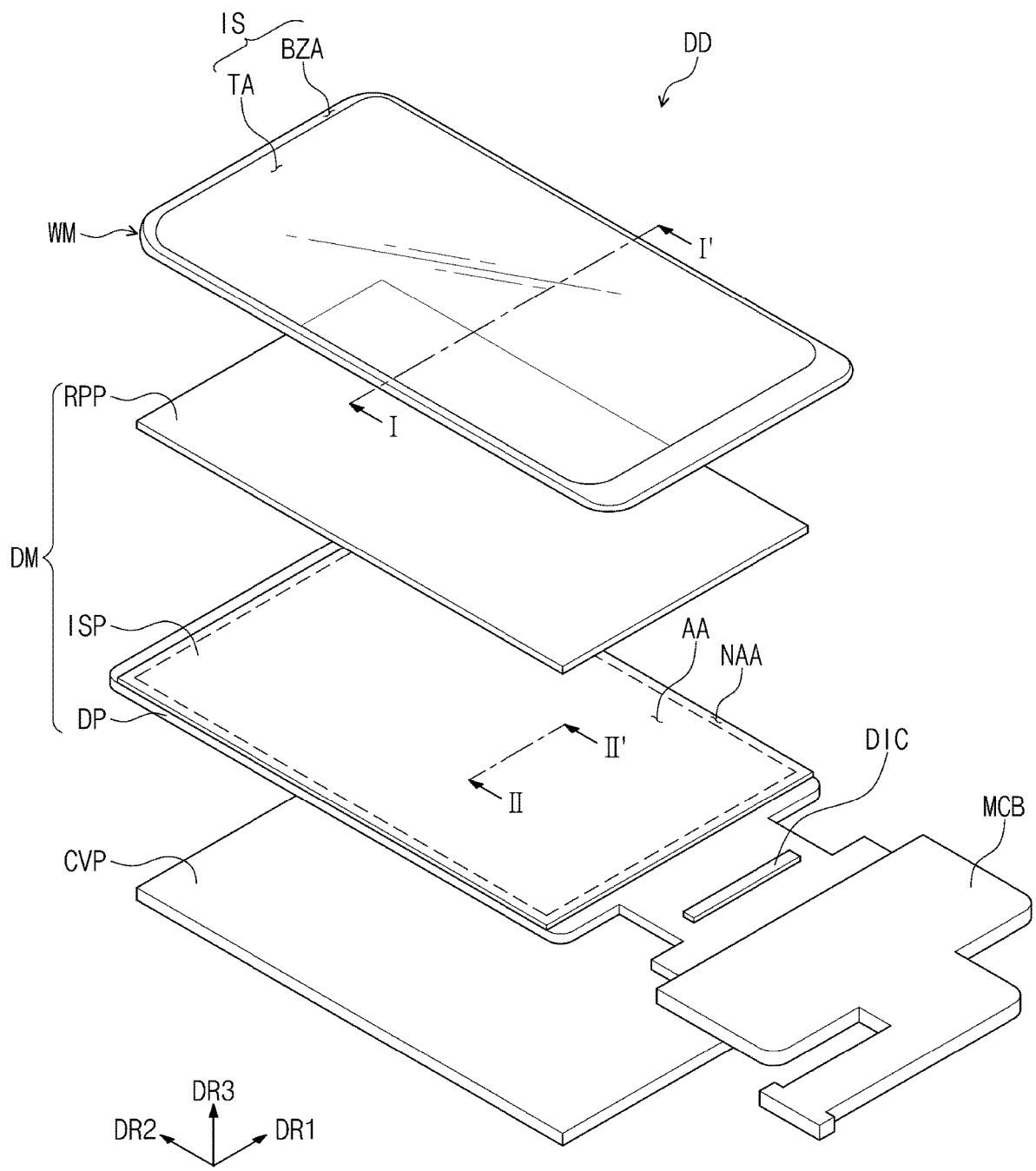
FIG. 1B is an exploded perspective view showing an embodiment of a display device.
Figure 2A:
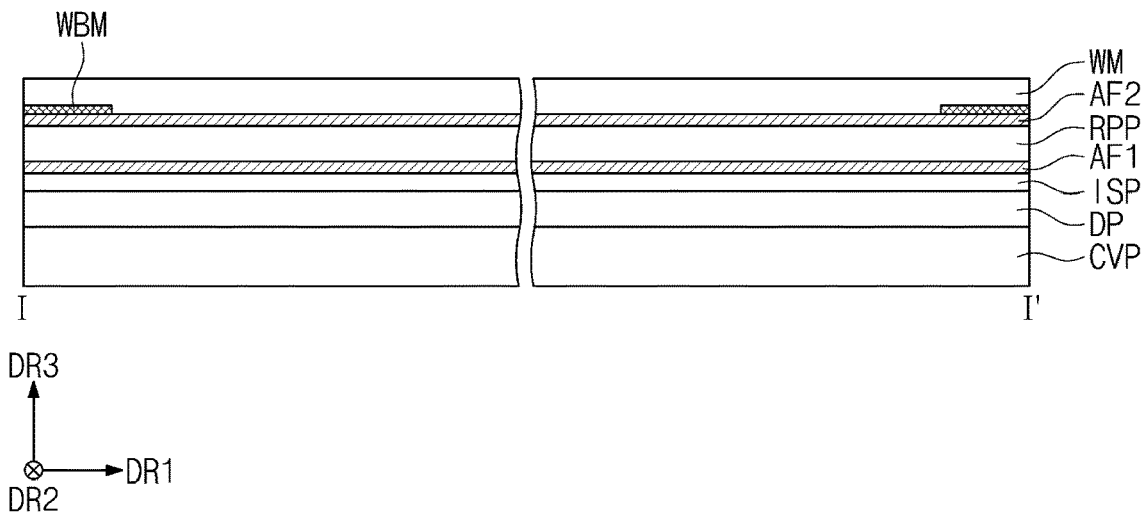
FIG. 2A is a cross-sectional view taken along line I-I' shown in FIG. 1B.
Figure 2B:
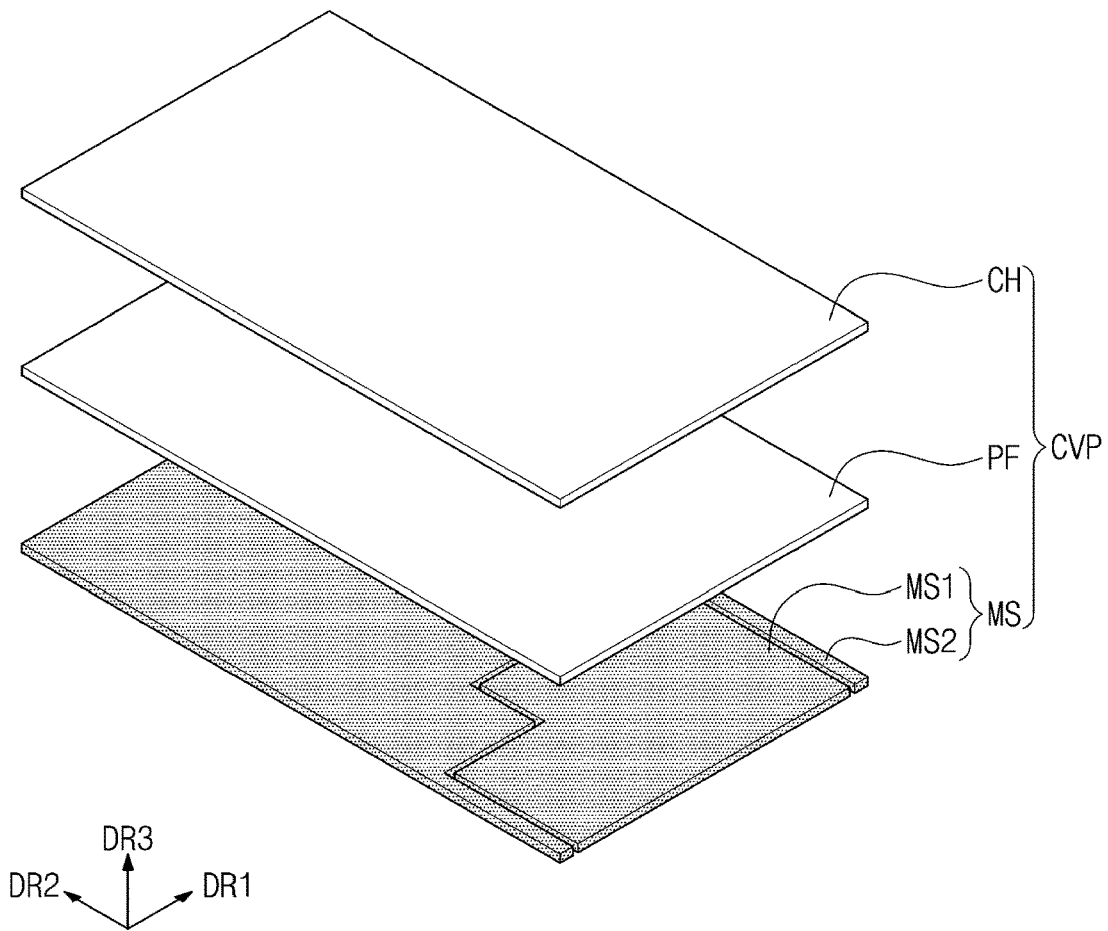
FIG. 2B is an exploded perspective view showing an embodiment of a cover panel in FIG. 1B.

FIG. 1A is a perspective view showing an embodiment of a display device DD, and FIG. 1B is an exploded perspective view showing an embodiment of the display device DD. FIG. 2A is a cross-sectional view taken along line I-I' shown in FIG. 1B, and FIG. 2B is an exploded perspective view showing an embodiment of a cover panel CVP shown in FIG. 1B.

Referring to FIGS. 1A and 1B, the display device DD may be activated in response to electrical signals. The display device DD may be applied to various electronic devices. In an embodiment, for example, the display device DD may be applied to electronic devices such as a smart watch, a tablet computer, a notebook computer, a computer or a smart television.

The display device DD may display an image IM in a third direction DR3 through a display surface IS disposed in a plane substantially parallel to a plane defined by a first direction DR1 and a second direction DR2 which cross each other. The display surface IS through which the image IM is displayed may correspond to a front surface of the display device DD. The image IM may include a still image as well as a motion image.

In the disclosure, front (or upper) and rear (or lower) surfaces of a member are defined with respect to a direction in which the image IM is displayed. The front and rear surfaces are opposite to each other along the third direction DR3, and a normal line direction of each of the front and rear surfaces is substantially parallel to the third direction DR3. A distance along the third direction DR3 between the front surface and the rear surface may correspond to a thickness of the display device DD and various members thereof. Directions indicated by the first, second and third directions DR1, DR2 and DR3 are relative to each other, and thus, the directions indicated by the first, second and third directions DR1, DR2 and DR3 may be changed to other directions.

The display device DD may sense an external input applied thereto from outside of the display device DD. The external input may include inputs of various forms provided from the outside of the display device DD.

In an embodiment, for example, the external input may include external inputs in proximity to or approaching close to the display device DD at a predetermined distance (e.g., a hovering input) as well as a touch or contact input by an input tool such as a hand of a user. In addition, the external input may include various forms, such as force, pressure, temperature and/or light.

The front surface of the display device DD may be divided into a transmission area TA (e.g., image transmission area) and a bezel area BZA. The image IM may be displayed through the transmission area TA. The transmission area TA may be referred to as a display area. The image IM may be viewable from outside of the display device DD, through the transmission area TA. The transmission area TA may have a quadrangular planar shape with rounded vertices, in a top plan view (e.g., in a direction opposite to the third direction DR3). However, this is merely exemplary, and the transmission area TA may have a variety of planar shapes and should not be particularly limited.

The bezel area BZA may be defined adjacent to the transmission area TA. The bezel area BZA may have a predetermined color. The image IM may not be displayed through the bezel area BZA, and may be referred to as a non-display area. The bezel area BZA may surround the transmission area TA in the top plan view. Accordingly, the planar shape of the transmission area TA may be defined by a shape of the bezel area BZA, however, this is merely exemplary. That is, the bezel area BZA may be disposed adjacent to only one side of the transmission area TA or may be omitted from the display device DD. The display device DD may be implemented in various embodiments, and should not be particularly limited.

As shown in FIGS. 1B and 2A, the display device DD may include a window WM, a display module DM, a cover panel CVP and an external case EDC. The display module DM may include a display panel DP, an input sensing unit ISP (e.g., input sensing layer), and an anti-reflective unit RPP (e.g., anti-reflective layer).

The window WM may include a transparent material through which an image IM is transmittable. In an embodiment, for example, the window WM may include glass, sapphire or plastic. The window WM is shown as a single layer, however, should not be limited thereto or thereby. The window WM may include plural layers. Although not shown in figures, the bezel area BZA of the display device DD may be obtained by providing a material having the predetermined color on an area of the window WM, such as by printing. As an example, the window WM may include a light blocking pattern WBM which defines the bezel area BZA. The light blocking pattern WBM may be a colored organic material layer and may be provided or formed by a coating method.

The display panel DP may be a light-emitting type display panel, however, should not be particularly limited. In an embodiment, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot and/or a quantum rod. Hereinafter, the organic light emitting display panel will be described as a representative example of the display panel DP.

The input sensing unit ISP may be disposed directly on the display panel DP. According to an embodiment, the input sensing unit ISP may be provided or formed on the display panel DP through successive processes. That is, when the input sensing unit ISP is disposed directly on the display panel DP, an adhesive film (e.g., intervening layer) may not be disposed between the input sensing unit ISP and the display panel DP.

The display panel DP may generate the image IM, and the input sensing unit ISP may obtain coordinate information about the external input, e.g., a touch event, described above.

The anti-reflective unit RPP may reduce a reflectance of an external light incident thereto from outside of the window WM. The anti-reflective unit RPP may include a retarder and a polarizer. The retarder may be a film type or liquid crystal coating type and may include a 212 retarder and/or a 214 retarder. The polarizer may be a film type or liquid crystal coating type. The film type polarizer may include a stretched type synthetic resin film, and the liquid crystal coating type polarizer may include liquid crystals aligned in a predetermined alignment. The retarder and the polarizer may be implemented as one polarizing film. The anti-reflective unit RPP may further include a protective film disposed above or under the polarizing film.

The anti-reflective unit RPP may be disposed on the input sensing unit ISP. That is, the anti-reflective unit RPP may be disposed between the input sensing unit ISP and the window WM which face each other. The input sensing unit ISP, the anti-reflective unit RPP and the window WM may be respectively coupled to each other by an intervening member such as an adhesive member. A first adhesive film AF1 (e.g., first adhesive layer) may be disposed between the input sensing unit ISP and the anti-reflective unit RPP, and a second adhesive film AF2 (e.g., second adhesive layer) may be disposed between the anti-reflective unit RPP and the window WM. Accordingly, the anti-reflective unit RPP may be coupled to the input sensing unit ISP by the first adhesive film AF1, and the window WM may be coupled to the anti-reflective unit RPP by the second adhesive film AF2.

In an embodiment for example, the first and second adhesive films AF1 and AF2 may be an optically clear adhesive ("OCA") film including an OCA. However, the first and second adhesive films AF1 and AF2 should not be limited thereto or thereby and may include a conventional adhesive. In an embodiment, for example, the first and second adhesive films AF1 and AF2 may include an optically clear resin ("OCR") and/or a pressure sensitive adhesive ("PSA") film.

The display module DM may generate and/or display the image IM in response to electrical signals and may transmit/receive information about the external input. The display module DM may include an active area AA and a peripheral area NAA. The active area AA may be defined as an area through which the image IM provided from the display module DM transmits.

The peripheral area NAA may be defined adjacent to the active area AA. In an embodiment, for example, the peripheral area NAA may surround the active area AA in the top plan view, however, the peripheral area NAA may be defined in various shapes and should not be particularly limited.

According to an embodiment, the active area AA of the display module DM may correspond to at least a portion of the transmission area TA.

The display module DM may further include a circuit board MCB and a driving chip DIC. The circuit board MCB may be electrically connected to the display panel DP. Electrical signals may be provided from the circuit board MCB to the display panel DP, to drive the display panel DP and display an image IM. The circuit board MCB may include a plurality of driving elements. The driving elements may include a circuit unit to drive the display panel DP.

The driving chip DIC may be mounted on the display panel DP. Electrical signals may be provided from or through the driving chip DIC, to drive the display panel DP and display an image IM. In this case, a portion of the display panel DP at which the driving chip DIC is mounted may be bent to be disposed facing a rear surface of the display module DM.

The driving chip DIC may include driving elements to drive pixels of the display panel DP, e.g., a data driving circuit. FIG. 1B shows a structure in which the driving chip DIC is mounted on the display panel DP, however, should not be limited thereto or thereby. In an embodiment, for example, the driving chip DIC may be mounted on a flexible circuit film FCB (refer to FIGS. 8 and 9) disposed between the display panel DP and the circuit board MCB. The structure in which the driving chip DIC is mounted on the flexible circuit film FCB will be described with reference to FIGS. 8 and 9.

The input sensing unit ISP may be electrically connected to the circuit board MCB, however, should not be limited thereto or thereby. That is, the display module DM may further include a separate one of the flexible circuit film FCB to electrically connect the input sensing unit ISP to the circuit board MCB.

The cover panel CVP may be disposed on a rear surface of the display panel DP. The cover panel CVP may include a heat dissipation layer MS. The heat dissipation layer MS may effectively dissipate heat generated by the display panel DP.

The heat dissipation layer MS may include a first heat dissipation sheet MS1 (e.g., first heat dissipation member) and a second heat dissipation sheet MS2 (e.g., second heat dissipation member). The first and second heat dissipation sheets MS1 and MS2 may be disposed to be spaced apart from each other by a predetermined distance, in a direction along the display panel DP. The circuit board MCB faces the display panel DP with the first heat dissipation sheet MS1 therebetween.

As an example, the first and second heat dissipation sheets MS1 and MS2 may include a same conductive material, such as a same metal material. In an embodiment, for example, the first and second heat dissipation sheets MS1 and MS2 may include a metal material having high heat conductivity, such as copper (Cu), aluminum (Al), gold (Au), or the like, however, should not be limited thereto or thereby. That is, the first and second heat dissipation sheets MS1 and MS2 may include different metal materials from each other. In addition, the first heat dissipation sheet MS1 may include a material having an electrical conductivity which is higher than an electrical conductivity of a material of the second heat dissipation sheet MS2. In an embodiment, for example, the first heat dissipation sheet MS1 may include gold, and the second heat dissipation sheet MS2 may include copper.

The cover panel CVP may further include a first layer PF and a second layer CH each disposed between the heat dissipation layer MS and the display panel DP. The first layer PF may be a polyimide ("PI") film. The first layer PF may be a base member or layer on which the first and second heat dissipation sheets MS1 and MS2 are disposed. An adhesive layer may be further disposed between the first and second heat dissipation sheets MS1 and MS2, and the first layer PF, respectively. Accordingly, the first and second heat dissipation sheets MS1 and MS2 may each be attached to the first layer PF by the adhesive layer. The first layer PF may be common to each of the first and second heat dissipation sheets MS1 and MS2.

The second layer CH may be an impact absorbing layer. The second layer CH may be disposed on the rear surface of the display panel DP and may improve an impact resistance of the display device DD. In an embodiment, the second layer CH is disposed between the display panel DP and the first layer PF, however, should not be limited thereto or thereby. In an embodiment, the second layer CH may be disposed between the first layer PF and the heat dissipation layer MS.

According to the disclosure, as the heat dissipation layer MS is disposed on the rear surface of the display panel DP, the heat generated by the display panel DP may be easily dissipated to outside of the display device DD, through the heat dissipation layer MS.

In an embodiment, at least one of the first and second layers PF and CH may be omitted, or another functional layer may be added to the cover panel CVP in addition to the first and second layers PF and CH.

The cover panel CVP may be fixed to the rear surface of the display panel DP by an adhesive layer. The adhesive layer may include a pressure sensitive adhesive ("PSA"), an optically clear adhesive ("OCA") or an optically clear resin ("OCR").

The external case EDC may accommodate the display module DM. The external case EDC may be coupled to the window WM and may define an exterior of the display device DD. The external case EDC may absorb impacts applied thereto from outside of the display device DD and may prevent foreign substances/moisture from entering the display module DM to protect components accommodated in the external case EDC. In an embodiment, the external case EDC may be an assembly of a plurality of separately provided accommodating members.

Figure 3:
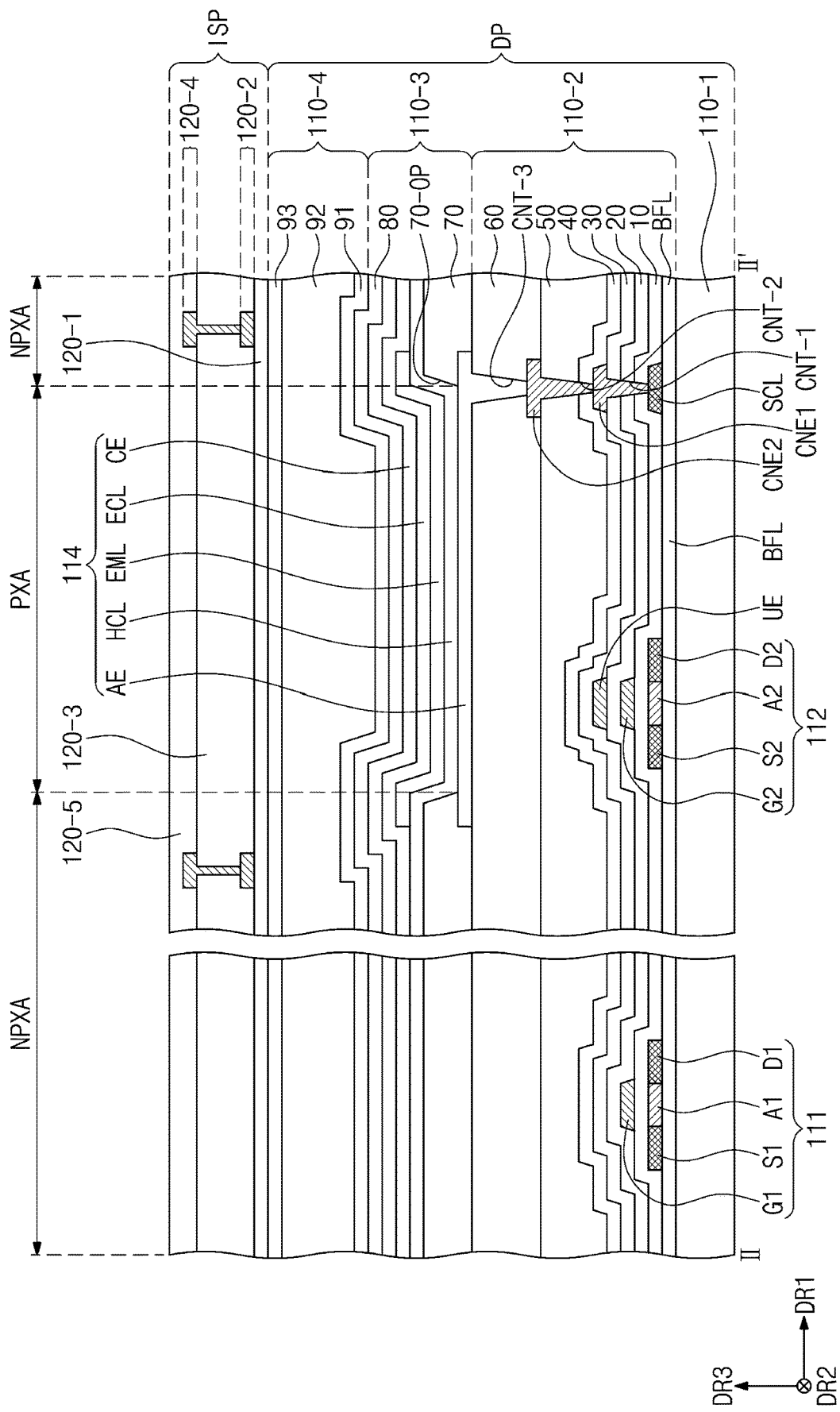
FIG. 3 is a cross-sectional view taken along line II-II' shown in FIG. 1B.

FIG. 3 is a cross-sectional view taken along line II-II' shown in FIG. 1B.

Referring to FIG. 3, the display panel DP may include a plurality of insulating layers, a semiconductor pattern, a conductive pattern and a signal line. An insulating layer, a semiconductor layer and a conductive layer may be provided or formed by a coating or depositing process. The insulating layer, the semiconductor layer and the conductive layer may be selectively patterned by a photolithography process. The semiconductor pattern, the conductive pattern and the signal line included in a circuit element layer 110-2, and a display element layer 110-3 may be provided or formed on a base layer 110-1. An encapsulation layer 110-4 may be provided or formed to cover the display element layer 110-3.

The base layer 110-1 may include a synthetic resin film. The synthetic resin film may include a heat-curable resin. The base layer 110-1 may have a multi-layer structure. In an embodiment, for instance, the base layer 110-1 may have a three-layer structure of a synthetic resin layer, an adhesive layer and a synthetic resin layer. In particular, the synthetic resin layer may be a polyimide-based resin layer, and a material for the synthetic resin layer should not be particularly limited. The synthetic resin layer may include at least one of an acrylic-based resin, a methacrylic-based resin, a polyisoprene, a vinyl-based resin, an epoxy-based resin, a urethane-based resin, a cellulose-based resin, a siloxane-based resin, a polyamide-based resin and a perylene-based resin. The base layer 110-1 may include a glass substrate or an organic/inorganic composite substrate.

At least one inorganic layer may be provided or formed on an upper surface of the base layer 110-1. The inorganic layer may include at least one of aluminum oxide, titanium oxide, silicon oxide, silicon oxynitride, zirconium oxide and hafnium oxide. The inorganic layer may be provided or formed by multiple layers. The inorganic layers may form a barrier layer and/or a buffer layer BFL. Referring to FIG. 3, the display panel DP may include a buffer layer BFL.

The buffer layer BFL may increase a coupling force between the base layer 110-1 and the semiconductor pattern. The buffer layer BFL may include a silicon oxide layer and a silicon nitride layer stacked on one another.

The semiconductor pattern may be disposed on the buffer layer BFL. The semiconductor pattern may include polysilicon, however, should not be limited thereto or thereby. The semiconductor pattern may include amorphous silicon or oxide semiconductor.

As shown in FIG. 3, a first semiconductor pattern of a first transistor 111 and a second semiconductor pattern of a second transistor 112 may be disposed on the buffer layer BFL. The first semiconductor pattern may include a first source Si, a first channel A1 and a first drain D1, and the second semiconductor pattern may include a second source S2, a second channel A2, and a second drain D2. In a direction along the base layer 110-1, the first channel A1 may be disposed between the first source S1 and the first drain D1, and the second channel A2 may be disposed between the second source S2 and the second drain D2. FIG. 3 shows a portion of a connection signal line SCL. Although not shown in figures, the connection signal line SCL may be connected to the second drain D2 of the second transistor 112 in a plan view.

A first insulating layer 10 may be disposed on the buffer layer BFL. The first insulating layer 10 may cover a plurality of semiconductor patterns. The first insulating layer 10 may be an inorganic layer and/or an organic layer and may have a single-layer or multi-layer structure. The first insulating layer 10 may include at least one of aluminum oxide, titanium oxide, silicon oxide, silicon oxynitride, zirconium oxide and hafnium oxide. In an embodiment, the first insulating layer 10 may have a single-layer structure of a silicon oxide layer. The first insulating layer 10 and an insulating layer of the circuit element layer 110-2 described later may be an inorganic layer and/or an organic layer and may have a single-layer or multi-layer structure. The inorganic layer may include at least one of the above-mentioned materials.

A first gate G1 of the first transistor 111 and a second gate G2 of the second transistor 112 may be disposed on the first insulating layer 10. The first and second gates G1 and G2 may overlap or correspond to the first and second channels A1 and A2, respectively.

A second insulating layer 20 may be disposed on the first insulating layer 10 and may cover the first and second gates G1 and G2. The second insulating layer 20 may be an inorganic layer and/or an organic layer and may have a single-layer or multi-layer structure. In an embodiment, the second insulating layer 20 may have a single-layer structure of a silicon oxide layer.

An upper electrode UE may be disposed on the second insulating layer 20. The upper electrode UE may overlap the second gate G2 of the second transistor 112. A portion of the second gate G2 and a portion of the upper electrode UE which overlaps the portion of the second gate G2 may form portions of a capacitor.

A third insulating layer 30 may be disposed on the second insulating layer 20 and may cover the upper electrode UE. In an embodiment, the third insulating layer 30 may have a single-layer structure of a silicon oxide layer. A first connection electrode CNE1 may be disposed on the third insulating layer 30. The first connection electrode CNE1 may be connected to the connection signal line SCL through a first contact hole CNT-1 defined extended through each of the first, second and third insulating layers 10, 20 and 30.

A fourth insulating layer 40 may be disposed on the third insulating layer 30. The fourth insulating layer 40 may have a single-layer structure of a silicon oxide layer. A fifth insulating layer 50 may be disposed on the fourth insulating layer 40. The fifth insulating layer 50 may be an organic layer. A second connection electrode CNE2 may be disposed on the fifth insulating layer 50. The second connection electrode CNE2 may be connected to the first connection electrode CNE1 through a second contact hole CNT-2 defined extended through each of the fourth insulating layer 40 and the fifth insulating layer 50.

A sixth insulating layer 60 may be disposed on the fifth insulating layer 50 and may cover the second connection electrode CNE2. The sixth insulating layer 60 may be an organic layer. A first electrode AE may be disposed on the sixth insulating layer 60. The first electrode AE may be connected to the second connection electrode CNE2 through a third contact hole CNT-3 defined extended through the sixth insulating layer 60.

An opening 70-OP may be defined extended through a pixel definition layer 70. The first electrode AE may be exposed to outside of the pixel definition layer 70, at or through the opening 70-OP of the pixel definition layer 70.

The active area AA (refer to FIG. 1B) may include a light emitting area PXA provided in plural (e.g., light emitting areas PXA) and a non-light-emitting area NPXA provided in plural (e.g., non-light emitting areas) defined adjacent to the light emitting areas PXA. The non-light-emitting area NPXA may surround the light emitting areas PXA in the top plan view. Each of the light emitting areas PXA may be defined to correspond to a portion of the first electrode AE which is exposed to outside the pixel definition layer 70 through the opening 70-OP.

A hole control layer HCL may be commonly disposed in the light emitting areas PXA and the non-light-emitting area NPXA. The hole control layer HCL may include a hole transport layer and may further include a hole injection layer. A light emitting layer EML may be disposed on the hole control layer HCL. The light emitting layer EML may be disposed in an area corresponding to the opening 70-OP. That is, the light emitting layer EML may be provided or formed in each of the pixels of the display panel DP after being divided into portions.

An electron control layer ECL may be disposed on the light emitting layer EML. The electron control layer ECL may include an electron transport layer and may further include an electron injection layer. The hole control layer HCL and the electron control layer ECL may be commonly provided or formed in the light emitting areas PXA such as by using an open mask.

A second electrode CE may be disposed on the electron control layer ECL. The second electrode CE may have an integral shape and may be commonly disposed in each of the light emitting areas PXA.

A capping layer 80 may be disposed on the second electrode CE. The capping layer 80 may include an organic material. The capping layer 80 may protect the second electrode CE from a process which provides the display device DD, such as a sputtering process, and may increase a light emission efficiency of a light emitting element 114 or display element. In an embodiment, the capping layer 80 may be omitted.

The encapsulation layer 110-4 may be disposed on the display element layer 110-3. The encapsulation layer 110-4 may include a first inorganic layer 91, an organic layer 92 and a second inorganic layer 93. The first inorganic layer 91 and the second inorganic layer 93 may protect the display element layer 110-3 from moisture and oxygen, and the organic layer 92 may protect the display element layer 110-3 from foreign substances such as dust particles. The first inorganic layer 91 and the second inorganic layer 93 may include one of a silicon nitride layer, a silicon oxynitride layer and a silicon oxide layer. In an embodiment, the first inorganic layer 91 and the second inorganic layer 93 may include a titanium oxide layer or an aluminum oxide layer. The organic layer 92 may include an acrylic-based organic layer, however, should not be particularly limited.

The input sensing unit ISP may include a base insulating layer 120-1, a first conductive layer 120-2, a sensing insulating layer 120-3 (e.g., intermediate insulating layer), a second conductive layer 120-4, and a cover insulating layer 120-5. The input sensing unit ISP may be provided or formed through successive processes after the display panel DP is provided or formed, however, should not be limited thereto or thereby.

The base insulating layer 120-1 may be disposed directly on the display panel DP. In an embodiment, for example, the base insulating layer 120-1 may be in contact (e.g., form an interface) with the second inorganic layer 93. The base insulating layer 120-1 may have a single-layer or multi-layer structure. In an embodiment, the base insulating layer 120-1 may be omitted. In an embodiment, the base insulating layer 120-1 may be provided or formed as a separate base layer, and the separate base layer may be coupled to the display panel DP by an intervening member such as an adhesive member.

Each of the first conductive layer 120-2 and the second conductive layer 120-4 may have a single-layer structure or a multi-layer structure of layers stacked along the third direction DR3. The conductive layer having the single-layer structure may include a metal layer or a transparent conductive layer. The metal layer may include molybdenum, silver, titanium, copper, aluminum, alloys thereof or a combination thereof. The transparent conductive layer may include a transparent conductive oxide, such as indium tin oxide ("ITO"), indium zinc oxide ("IZO"), zinc oxide ("ZnO"), indium tin zinc oxide ("ITZO"). In addition, the transparent conductive layer may include a conductive polymer (e.g., poly(3,4-ethylenedioxythiophene) ("PEDOT")), a metal nanowire, and a graphene.

The conductive layer having the multi-layer structure may include a plurality of metal layers. The metal layers may have a three-layer structure of titanium/aluminum/titanium. The conductive layer of the multi-layer structure may include at least one metal layer and at least one transparent conductive layer.

Each of the first conductive layer 120-2 and the second conductive layer 120-4 may include conductive patterns that form sensing electrodes. The input sensing unit ISP may obtain information about external inputs based on a variation in capacitance between the sensing electrodes.

The sensing insulating layer 120-3 may be disposed between the first conductive layer 120-2 and the second conductive layer 120-4 and may cover the first conductive layer 120-2. A portion of the second conductive layer 120-4 may be electrically connected to a portion of the first conductive layer 120-2 through a contact hole defined extended through the sensing insulating layer 120-3. The cover insulating layer 120-5 may be disposed on the sensing insulating layer 120-3 and may cover the second conductive layer 120-4.

In an embodiment, at least one of the sensing insulating layer 120-3 and the cover insulating layer 120-5 may include an inorganic layer. The inorganic layer may include at least one of aluminum oxide, titanium oxide, silicon oxide, silicon oxynitride, zirconium oxide and hafnium oxide.

In an embodiment, at least one of the sensing insulating layer 120-3 and the cover insulating layer 120-5 may include an organic layer. The organic layer may include at least one of an acrylic-based resin, a methacrylic-based resin, a polyisoprene, a vinyl-based resin, an epoxy-based resin, a urethane-based resin, a cellulose-based resin, a siloxane-based resin, a polyimide-based resin, a polyamide-based resin and a perylene-based resin.

Figure 4A:
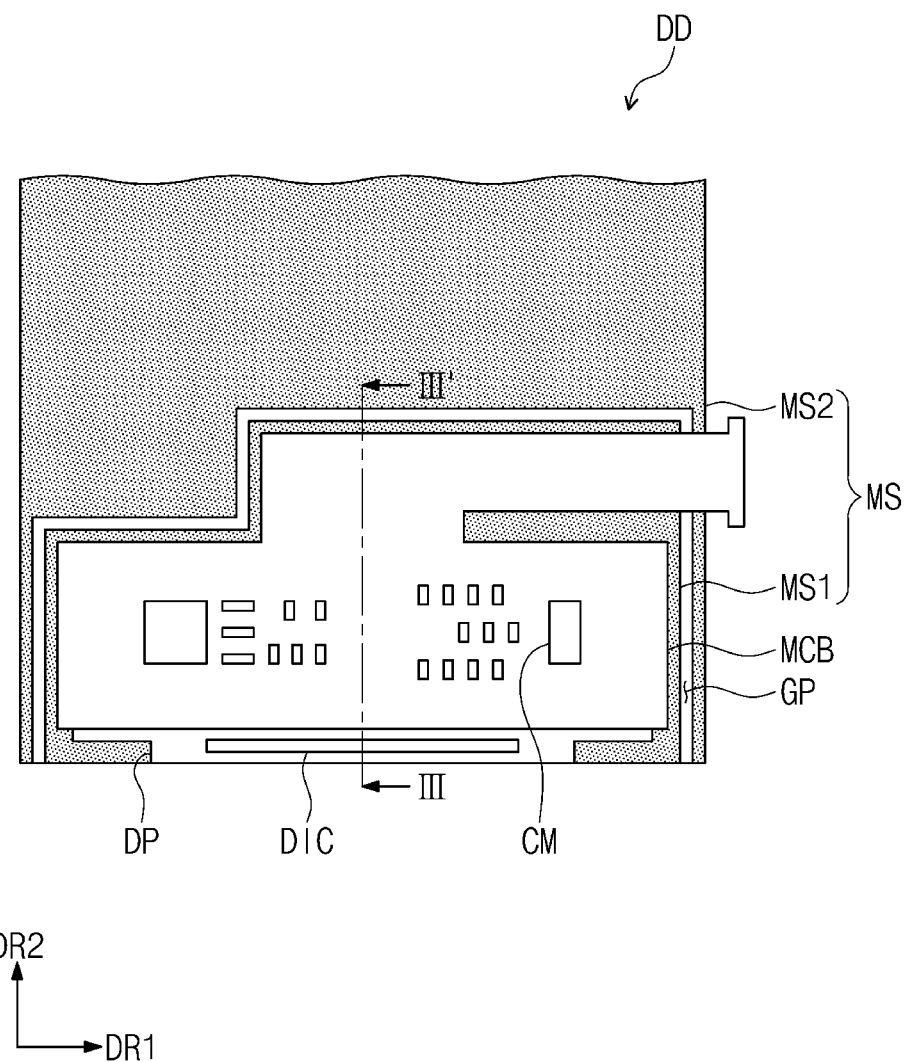
FIG. 4A is a rear view showing an embodiment of a portion of a rear surface of a display device.
Figure 4B:
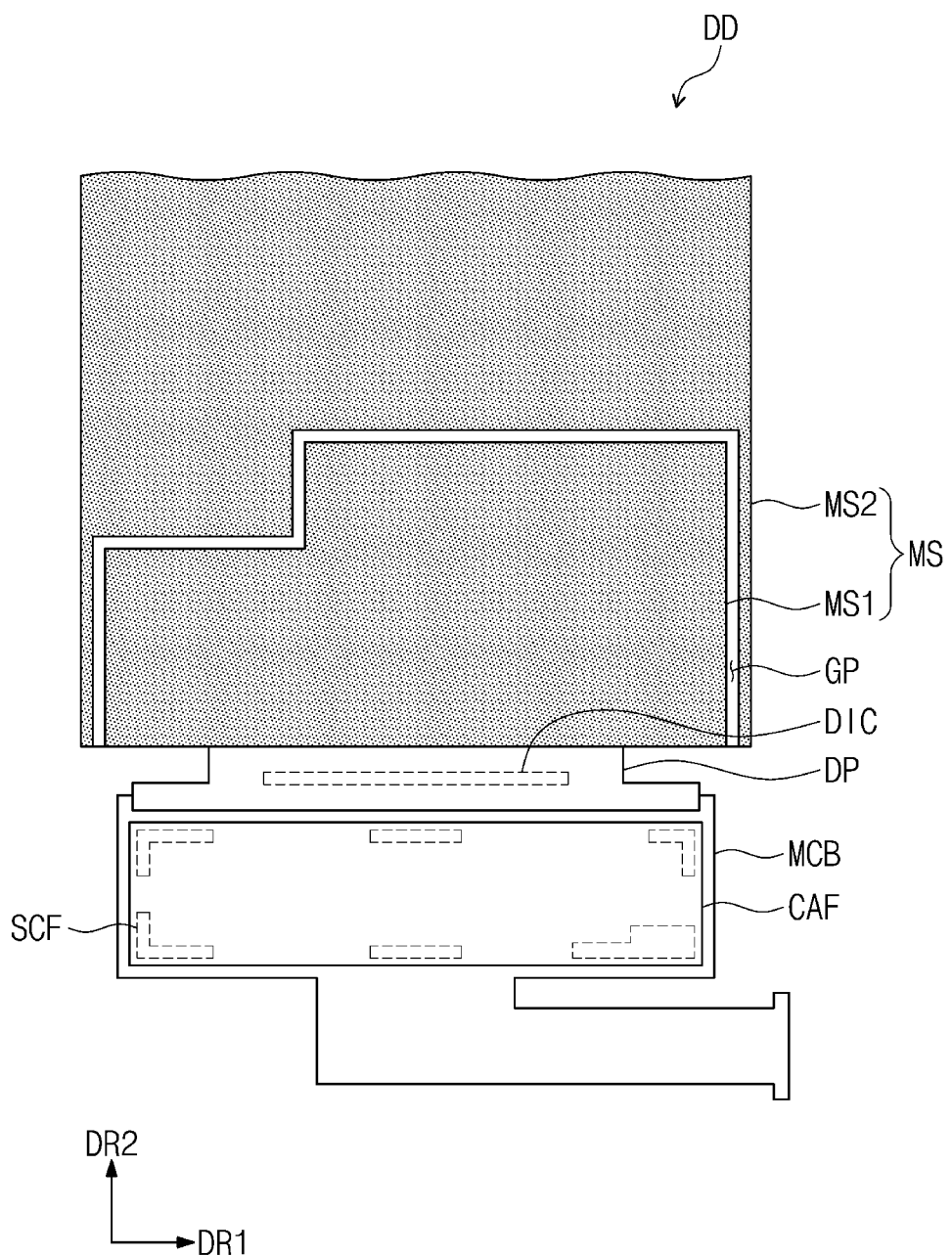
FIG. 4B is a rear view showing an embodiment of first and second heat dissipation sheets and a circuit board in FIG. 4A.
Figure 5A:
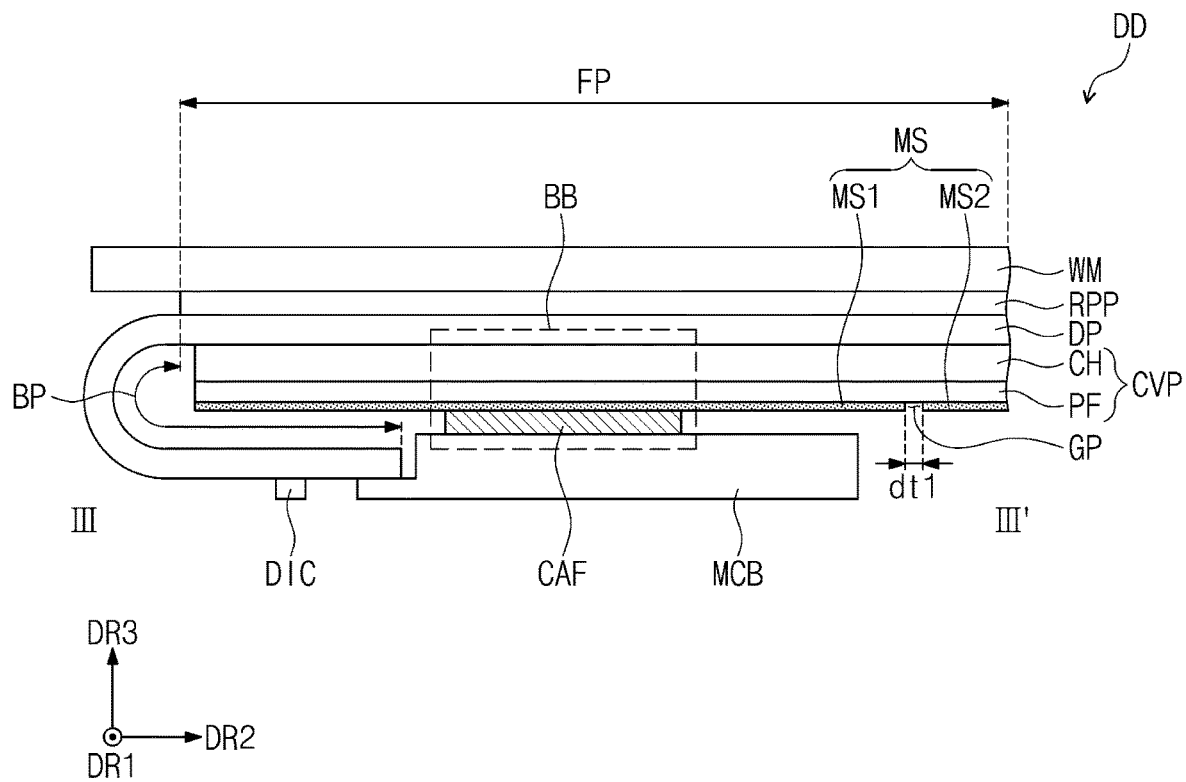
FIG. 5A is a cross-sectional view taken along line III-III' shown in FIG. 4A.
Figure 5B:
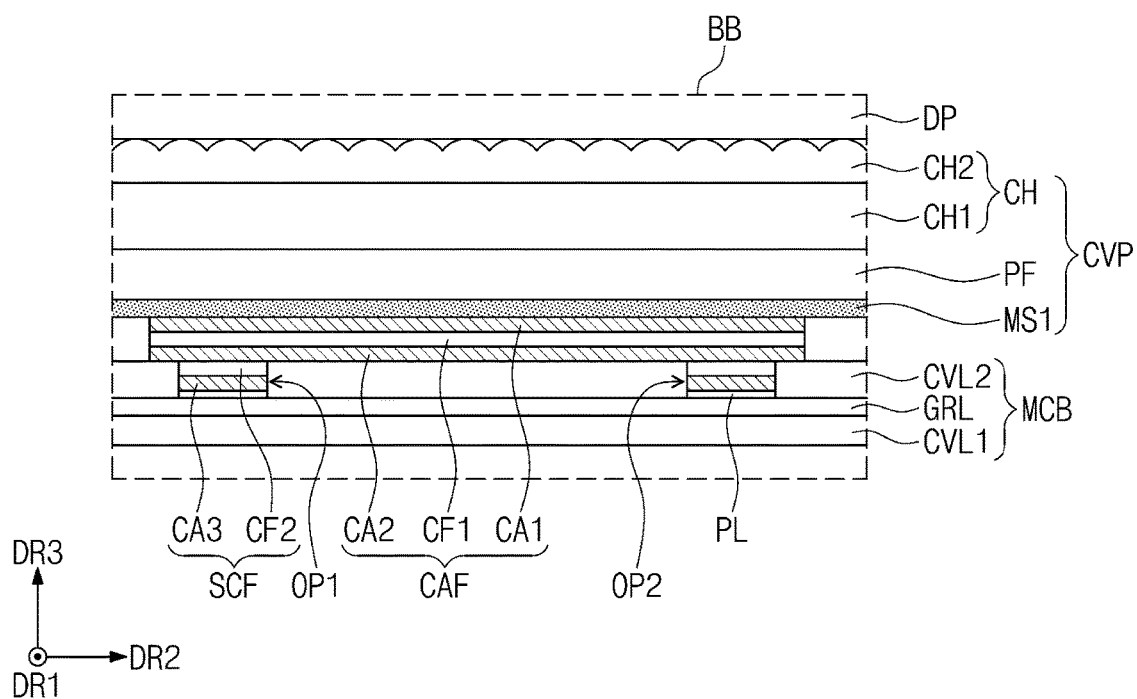
FIG. 5B is an enlarged cross-sectional view showing an embodiment of a portion BB in FIG. 5A.

FIG. 4A is a rear view showing an embodiment of a portion of a rear surface of the display device DD, and FIG. 4B is a rear view showing an embodiment of the first and second heat dissipation sheets MS1 and MS2 and the circuit board MCB shown in FIG. 4A. FIG. 5A is a cross-sectional view taken along line III-III' shown in FIG. 4A, and FIG. 5B is an enlarged cross-sectional view showing an embodiment of a portion BB shown in FIG. 5A.

Referring to FIGS. 4A, 4B, 5A and 5B, the cover panel CVP may be disposed on the rear surface of the display panel DP. The rear surface is opposite to the front surface along the third direction DR3. The cover panel CVP may include the heat dissipation layer MS, the first layer PF and the second layer CH.

The heat dissipation layer MS may include the first and second heat dissipation sheets MS1 and MS2. The first and second heat dissipation sheets MS1 and MS2 may be disposed to be spaced apart from each other along a plane defined by the first direction DR1 and the second direction DR2 intersecting each other. In an embodiment, the first and second heat dissipation sheets MS1 and MS2 may be spaced apart from each other by a first distance dt1. The first distance dt1 should not be particularly limited. A gap GP may be defined between the first and second heat dissipation sheets MS1 and MS2. Referring to FIG. 4A, for example, the gap GP may not overlap the driving chip DIC in the plan view. In the display panel DP which is bent, the first heat dissipation sheet MS1 may be disposed to overlap or correspond to the driving chip DIC and the circuit board MCB. In an embodiment, the first heat dissipation sheet MS1 may have a planar shape corresponding to the circuit board MCB. That is, the first heat dissipation sheet MS1 may have an amorphous shape, and a shape of the first heat dissipation sheet MS1 should not be particularly limited.

The display panel DP may include a flat portion FP, and a bending portion BP at which the display panel DP is bendable. The flat portion FP extends from the bending portion BP. The flat portion FP may be a portion of the display panel DP which is not bendable or remains flat when the bending portion BP is bent. The bending portion BP may be bent to face the flat portion FP along the third direction DR3 (FIGS. 5A and 5B). The driving chip DIC may be mounted on the bending portion BP of the display panel DP. The display panel DP which is bent at the bending portion BP disposes the bending portion BP to face the flat portion FP.

Referring to FIGS. 4A and 4B, the first heat dissipation sheet MS1 may be disposed to overlap the driving chip DIC and the bending portion BP of the display panel DP. The display panel DP which is unbent or flat (FIG. 4B) disposes the driving chip DIC and the circuit board MCB non-overlapping with the heat dissipation layer MS. The display panel DP which is bent (FIG. 4A) disposes the driving chip DIC and the circuit board MCB facing the heat dissipation layer MS.

The display panel DP which is bent (FIG. 4A) disposes the second heat dissipation sheet MS2 non-overlapping with the driving chip DIC and the bending portion BP of the display panel DP. FIG. 4A shows a structure in which the second heat dissipation sheet MS2 partially overlaps the circuit board MCB, however, the second heat dissipation sheet MS2 and the circuit board MCB should not be limited to the structure. In an embodiment, for example, the display panel DP which is bent (FIG. 4A) may dispose the second heat dissipation sheet MS2 non-overlapping with the circuit board MCB.

The display device DD may further include a conductive adhesive film CAF (e.g., conductive adhesive layer) to attach the first heat dissipation sheet MS1 to the circuit board MCB. The circuit board MCB may be fixed to a rear surface of the first heat dissipation sheet MS1 by the conductive adhesive film CAF. Some conductive lines or signal lines (e.g., a ground line GRL shown in FIG. 5B) of the circuit board MCB may be electrically connected to the first heat dissipation sheet MS1 via the conductive adhesive film CAF. That is, the circuit board MCB may be electrically connected to the first heat dissipation sheet MS1 and may form an electrostatic path. The second heat dissipation sheet MS2 may be disposed spaced apart from (e.g., electrically insulated from) the first heat dissipation sheet MS1, and thus, the second heat dissipation sheet MS2 may be electrically insulated from the circuit board MCB electrically connected to the first heat dissipation sheet MS1.

The conductive adhesive film CAF may be a double-sided adhesive film. Accordingly, the conductive adhesive film CAF may be attached to each of the rear surface of the first heat dissipation sheet MS1 and a rear surface of the circuit board MCB. Referring to FIGS. 5A and 5B, the display panel DP which is bent at the bending portion BP disposes the rear surface of the first heat dissipation sheet MS1 facing the rear surface of the circuit board MCB.

As shown in FIG. 5B, the conductive adhesive film CAF may include a first conductive film CF1 (e.g., first conductive pattern), a first conductive adhesive CA1 (e.g., first conductive adhesive pattern) and a second conductive adhesive CA2 (e.g., second conductive adhesive pattern). The first conductive film CF1 may include a conductive fabric or a metal thin film as a base film thereof. The first conductive adhesive CA1 may be disposed between the first conductive film CF1 and the rear surface of the first heat dissipation sheet MS1, and the second conductive adhesive CA2 may be disposed between the first conductive film CF1 and the rear surface of the circuit board MCB.

Each of the first and second conductive adhesives CA1 and CA2 may include a conductive adhesive material. In an embodiment, for example, each of the first and second conductive adhesives CA1 and CA2 may be a film provided or formed by distributing metal particles of gold, silver, platinum, nickel, copper or carbon, in a synthetic resin. The synthetic resin may include a material of epoxy, silicon, polyimide or polyurethane.

The conductive adhesive film CAF may be attached to each of the rear surface of the first heat dissipation sheet MS1 and the rear surface of the circuit board MCB, by the first and second conductive adhesives CA1 and CA2, respectively.

A circuit component CM, such as a control chip, a plurality of passive elements, a plurality of active elements, etc., may be provided such as by mounting, on the circuit board MCB. The circuit board MCB may include the rear surface (e.g., viewable in FIG. 4B) which faces the first heat dissipation sheet MS1 in the display panel DP which is bent (FIGS. 4A, 5A and 5B). An upper surface of the circuit board MCB (e.g., viewable in FIG. 4A) may be opposite to the rear surface of circuit board MCB.

The circuit board MCB may include the ground line GRL, a first cover layer CVL1, a second cover layer CVL2, and a step difference compensation film SCF (e.g., step difference compensation pattern). The first and second cover layers CVL1 and CVL2 may include an insulating material. The upper surface of the circuit board MCB may be defined by a first surface of the first cover layer CVL1, however, should not be limited thereto or thereby. The circuit board MCB may further include a plurality of cover layers in addition to the first and second cover layers CVL1 and CVL2. In this case, the upper surface of the circuit board MCB may be defined by an upper surface of an outermost cover layer among the cover layers (e.g., furthest from the flat portion FP of the display panel DP). The ground line GRL may be disposed on a second surface of the first cover layer CVL1 which is opposite to the first surface thereof. The ground line GRL may be a copper line and may receive a ground voltage.

The ground line GRL may be covered by the second cover layer CVL2. The second cover layer CVL2 may be provided with a first opening OP1 and a second opening OP2 through which portions of the ground line GRL are exposed. That is, each of the first opening OP1 and the second opening OP2 is defined through the second cover layer CVL2 and exposes a portion of the ground line GRL to outside the second cover layer CVL2 to define an exposed portion of the ground line GRL. Other conductive lines or signal lines may be disposed on the second surface of the first cover layer CVL1 in addition to the ground line GRL, however, are omitted in FIG. 5B for the convenience of explanation.

The step difference compensation film SCF may be disposed to correspond to each of the first opening OP1 and the second opening OP2, and may be electrically connected to the ground line GRL at the openings. The step difference compensation film SCF forms an interface with both the conductive adhesive film CAF and an exposed portion of the ground line GRL. In addition, the step difference compensation film SCF may compensate for a step difference occurring in the second cover layer CVL2, which is caused by the first opening OP1 and the second opening OP2.

The step difference compensation film SCF may include a second conductive film CF2 (e.g., second conductive pattern) and a third conductive adhesive CA3 (e.g., third conductive adhesive pattern). The second conductive film CF2 may serve as a base film of the step difference compensation film SCF. The second conductive film CF2 may have a thickness sufficient to compensate for the step difference occurring in the second cover layer CVL2. The second conductive film CF2 may include a material having an electrical conductivity. In an embodiment, for example, the second conductive film CF2 may include the same material as that of the first conductive film CF1. The third conductive adhesive CA3 may be disposed between the second conductive film CF2 and the ground line GRL. The third conductive adhesive CA3 may include a conductive adhesive material. In an embodiment, for example, the third conductive adhesive CA3 may include or be formed of the same material as that of the first and second conductive adhesives CA1 and CA2.

In an embodiment, the circuit board MCB may further include a protective metal layer PL that covers the portion of the ground line GRL exposed through the first opening OP1 and the second opening OP2. The protective metal layer PL may be provided to reduce or effectively prevent the ground line GRL from being oxidized or corroded. In an embodiment, for example, the protective metal layer PL may include a metal material, e.g., gold (Au), that is resistant to oxidation and corrosion.

Where the protective metal layer PL is provided, the step difference compensation film SCF may be attached to the protective metal layer PL by the third conductive adhesive CA3. When the protective metal layer PL is omitted, the step difference compensation film SCF may be attached directly to the ground line GRL.

The second conductive film CF2 of the step difference compensation film SCF may be attached to the second conductive adhesive CA2 of the conductive adhesive film CAF. Accordingly, the conductive adhesive film CAF may be electrically connected to the ground line GRL through the step difference compensation film SCF. Therefore, the first heat dissipation sheet MS1 and the ground line GRL are electrically connected to each other via the conductive adhesive film CAF together with the step difference compensation film SCF, and thus, the electrostatic path may be provided or formed between the cover panel CVP and the circuit board MCB.

Thus, when static electricity is generated, the static electricity may be dissipated through the electrostatic path, and as a result, damage to the circuit component CM mounted on the circuit board MCB or to the driving chip DIC mounted on the display panel DP, due to the static electricity, may be reduced or effectively prevented. In particular, since the first heat dissipation sheet MS1 is separated from (e.g., electrically insulated from) the second heat dissipation sheet MS2, damage to the circuit component CM mounted on the circuit board MCB or to the driving chip DIC mounted on the display panel DP, due to the static electricity introduced through the second heat dissipation sheet MS2, may be reduced or effectively prevented.

As shown in FIG. 5B, the second layer CH of the cover panel CVP may include a cushion layer CH1 and an embossed structure layer CH2 (e.g., embossed layer). The cushion layer CH1 is disposed facing the display panel DP with the embossed structure layer CH2 therebetween. The cushion layer CH1 may have a porous structure having elasticity. The cushion layer CH1 may include a synthetic resin foam. In an embodiment, for example, the cushion layer CH1 may include at least one of acrylonitrile butadiene styrene copolymer ("ABS"), polyurethane ("PU"), polyethylene ("PE"), ethylene vinyl acetate ("EVA") and polyvinyl chloride ("PVC").

The embossed structure layer CH2 may include a plurality of protrusions protruding in the third direction DR3. The protrusions may have an embossed shape, defined by peaks and valleys alternated with each other in a direction along the display panel DP. The protrusions may protrude toward the display panel DP. Each protrusion may have a semicircular shape when viewed in a cross-section. However, each protrusion may have a triangular shape and should not be particularly limited. The embossed structure layer CH2 may include an elastic material. Accordingly, the embossed structure layer CH2 and the cushion layer CH1 may improve an impact resistance of the cover panel CVP.

In an embodiment, the embossed structure layer CH2 may include a light blocking material. As including the light blocking material, the embossed structure layer CH2 may reduce or effectively prevent the components disposed on the rear surface of the display panel DP from being visible from outside the display panel DP.

Figure 6A:
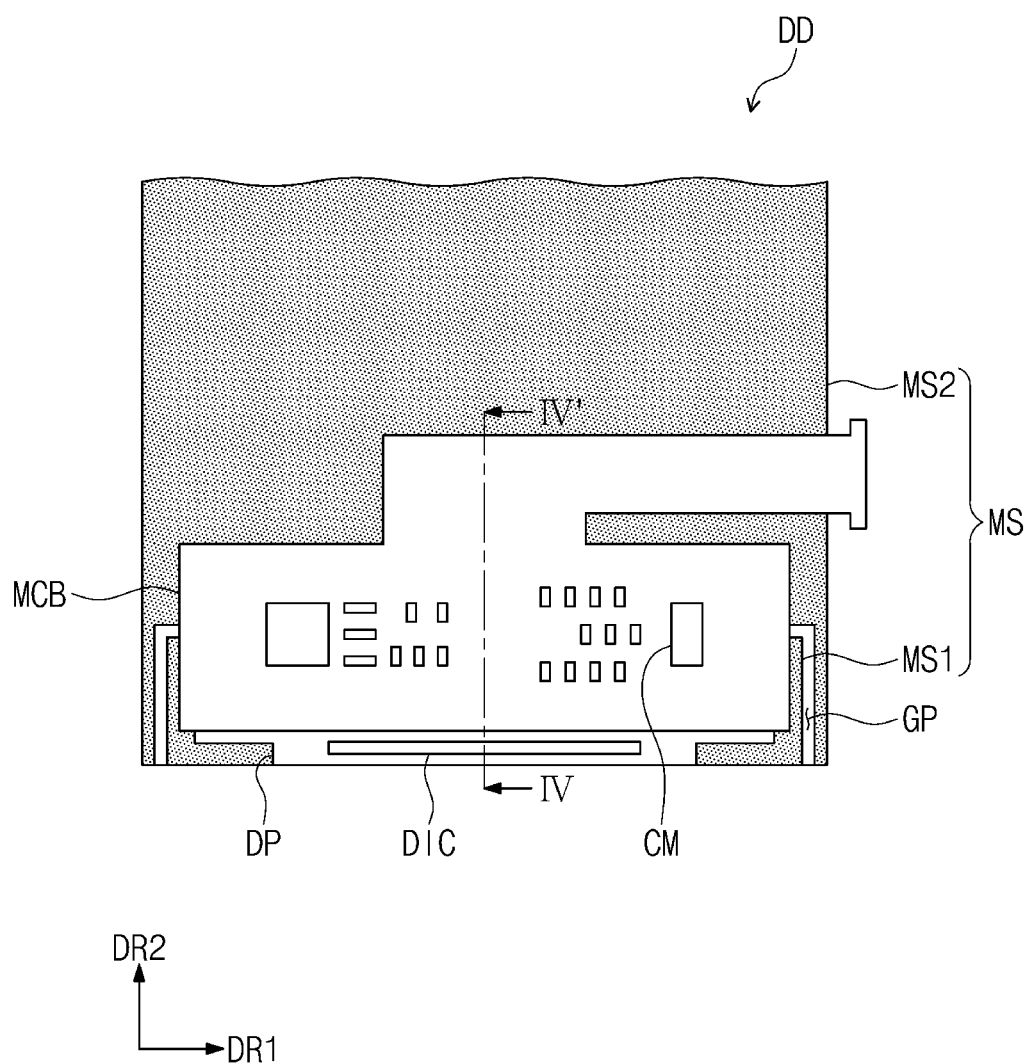
FIG. 6A is a rear view showing an embodiment of a portion of a rear surface of a display device.
Figure 6B:
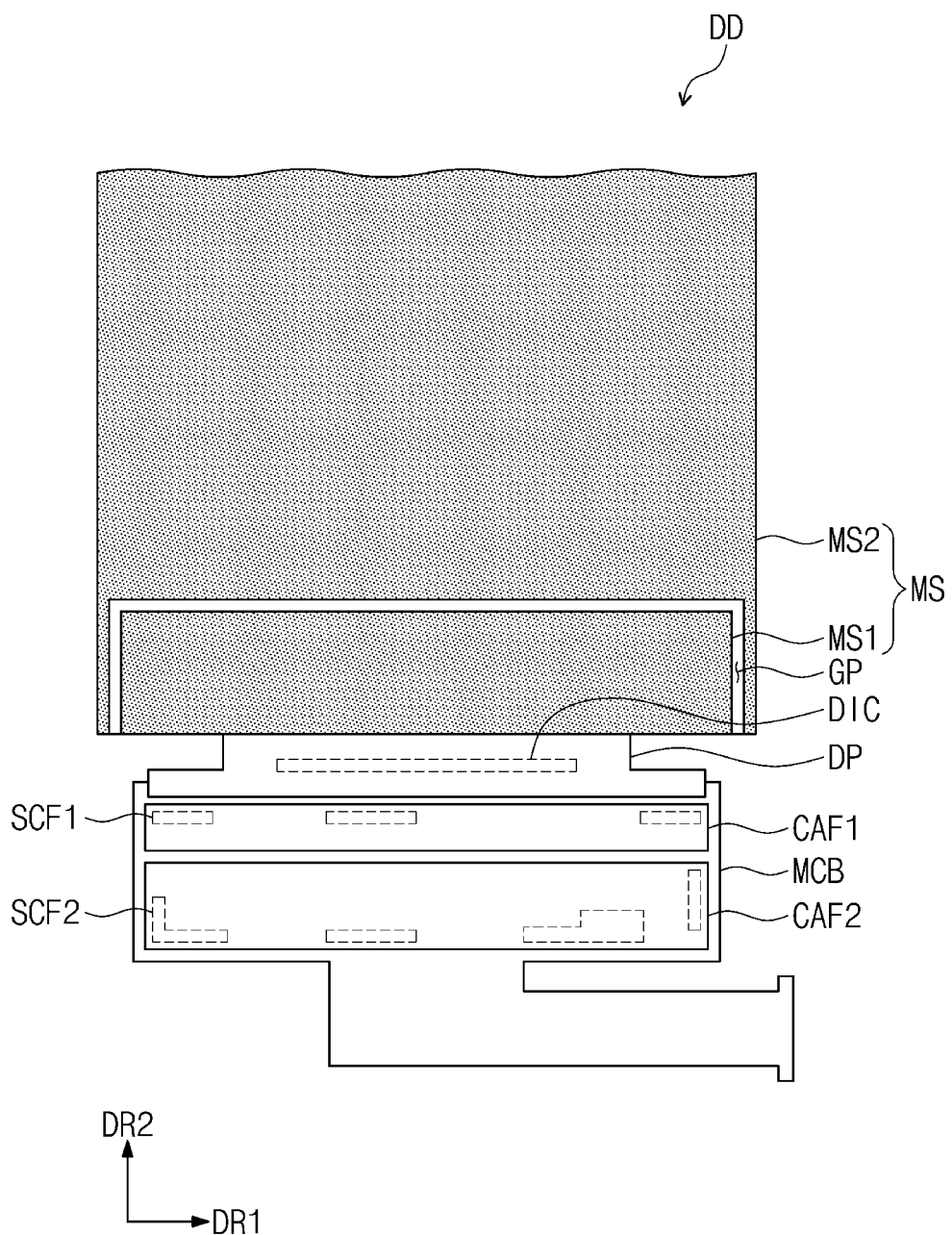
FIG. 6B is a rear view showing an embodiment of first and second heat dissipation sheets and a circuit board in FIG. 6A.
Figure 7B:
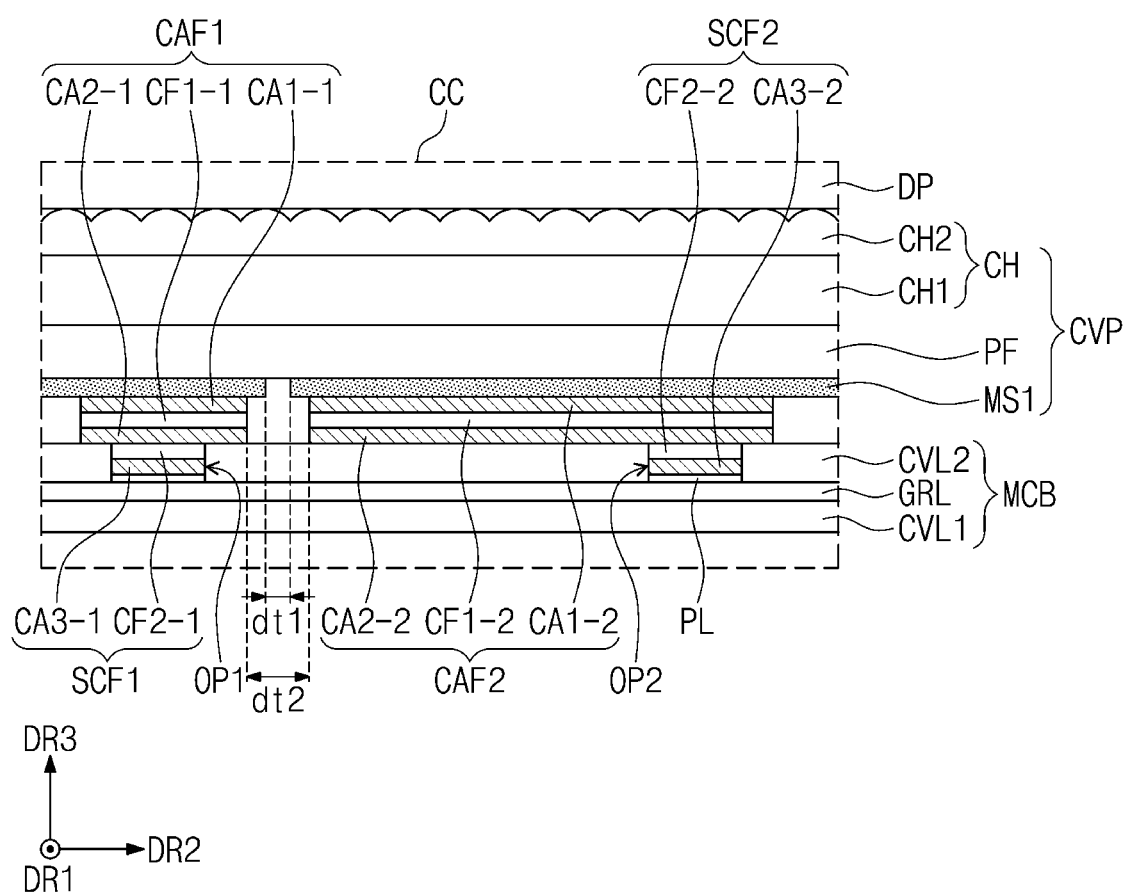
FIG. 7B is an enlarged cross-sectional view showing an embodiment of a portion CC in FIG. 7A.

FIG. 6A is a rear view showing an embodiment of a portion of a rear surface of a display device DD, and FIG. 6B is a rear view showing an embodiment of first and second heat dissipation sheets MS1 and MS2 and a circuit board MCB shown in FIG. 6A. FIG. 7A is a cross-sectional view taken along line IV-IV' shown in FIG. 6A, and FIG. 7B is an enlarged cross-sectional view showing an embodiment of a portion CC shown in FIG. 7A. In FIGS. 6A, 6B, 7A and 7B. The same reference numerals denote the same elements in FIGS. 4A to 5B, and thus, detailed descriptions of the same elements will be omitted for FIGS. 6A to 7B.

Referring to FIGS. 6A to 7B, a cover panel CVP may be disposed on the rear surface of a display panel DP. The cover panel CVP may include a heat dissipation layer MS, a first layer PF and a second layer CH.

The heat dissipation layer MS may include the first and second heat dissipation sheets MS1 and MS2. The first and second heat dissipation sheets MS1 and MS2 may be disposed to be spaced apart from each other along a plane defined by a first direction DR1 and a second direction DR2 intersecting with each other. In an embodiment, the first and second heat dissipation sheets MS1 and MS2 may be disposed to be spaced apart from each other by a first distance dt1. The first distance dt1 should not be particularly limited. A gap GP may be defined between the first and second heat dissipation sheets MS1 and MS2. Referring to FIG. 6A, for example, the gap GP may not overlap a driving chip DIC in the plan view.

In the display panel DP which is bent (FIG. 6A), the first heat dissipation sheet MS1 may be disposed to overlap or correspond to the driving chip DIC and the circuit board MCB. In an embodiment, the first heat dissipation sheet MS1 may have a planar quadrangular shape and may partially overlap the circuit board MCB. The first heat dissipation sheet MS1 may be disposed to overlap the driving chip DIC and a bending portion BP of the display panel DP.

The display panel DP which is bent (FIG. 6A), disposes the second heat dissipation sheet MS2 non-overlapping with the driving chip DIC and the bending portion BP of the display panel DP. FIG. 7A shows a structure in which the display panel DP is bent and disposes the second heat dissipation sheet MS2 partially overlapping the circuit board MCB, however, should not be limited thereto or thereby. In an embodiment, for example, the display panel DP which is bent may dispose the second heat dissipation sheet MS2 non-overlapping with the circuit board MCB.

The display device DD may further include a first conductive adhesive film CAF1 (e.g., first conductive adhesive layer) and a second conductive adhesive film CAF2 (e.g., second conductive adhesive layer). The first conductive adhesive film CAF1 faces the display panel DP with the first heat dissipation sheet MS1 therebetween, and the second conductive adhesive film CAF2 faces the display panel DP with the second heat dissipation sheet MS2 therebetween.

The circuit board MCB may be fixed to a rear surface of the first heat dissipation sheet MS1 by the first conductive adhesive film CAF1 and may be fixed to a rear surface of the second heat dissipation sheet MS2 by the second conductive adhesive film CAF2. Some conductive lines or signal lines (e.g., a ground line GRL shown in FIG. 7B) of the circuit board MCB may be electrically connected to the first heat dissipation sheet MS1 via the first conductive adhesive film CAF1. That is, the circuit board MCB may be electrically connected to the first heat dissipation sheet MS1 and may form an electrostatic path. The second heat dissipation sheet MS2 may be electrically connected to the ground line GRL of the circuit board MCB through the second conductive adhesive film CAF2. That is, the circuit board MCB may be electrically connected to the second heat dissipation sheet MS2 to form an electrostatic path.

Each of the first and second conductive adhesive films CAF1 and CAF2 may be a double-sided adhesive film. Accordingly, the first conductive adhesive film CAF1 may be attached to each of a rear surface of the first heat dissipation sheet MS1 and a rear surface of the circuit board MCB, and the second conductive adhesive film CAF2 may be attached to each of a rear surface of the second heat dissipation sheet MS2 and the rear surface of the circuit board MCB.

As shown in FIG. 7B, the first conductive adhesive film CAF1 may include a first conductive film CF1-1, a first conductive adhesive CA1-1, and a second conductive adhesive CA2-1. The first conductive adhesive CA1-1 may be disposed between the first conductive film CF1-1 and the rear surface of the first heat dissipation sheet MS1, and the second conductive adhesive CA2-1 may be disposed between the first conductive film CF1-1 and the rear surface of the circuit board MCB. Accordingly, the first conductive adhesive film CAF1 may be attached to each of the rear surface of the first heat dissipation sheet MS1 and the circuit board MCB by the first and second conductive adhesives CA1-1 and CA2-1.

The second conductive adhesive film CAF2 may include a first conductive film CF1-2, a first conductive adhesive CA1-2, and a second conductive adhesive CA2-2. The first conductive adhesive CA1-2 may be disposed between the first conductive film CF1-2 and the rear surface of the second heat dissipation sheet MS2, and the second conductive adhesive CA2-2 may be disposed between the first conductive film CF1-2 and the rear surface of the circuit board MCB. Accordingly, the second conductive adhesive film CAF2 may be attached to each of the rear surface of the second heat dissipation sheet MS2 and the circuit board MCB by the first and second conductive adhesives CA1-2 and CA2-2.

The first and second conductive adhesive films CAF1 and CAF2 may be disposed to correspond to the gap GP between the first and second heat dissipation sheets MS1 and MS2 and may be spaced apart from each other (e.g., disconnected from each other) by the gap GP. In an embodiment, the first and second heat dissipation sheets MS1 and MS2 may be spaced apart from each other by a first distance dt1, and the first and second conductive adhesive films CAF1 and CAF2 may be spaced apart from each other by a second distance dt2. In an embodiment, the second distance dt2 may be equal to or greater than the first distance dt1.

The circuit board MCB may include a first step difference compensation film SCF1 (e.g., first step difference compensation pattern) and a second step difference compensation film SCF2 (e.g., second step difference compensation pattern). The first step difference compensation film SCF1 may be disposed to correspond to a first opening OP1 and may be electrically connected to the ground line GRL. The second step difference compensation film SCF2 may be disposed to correspond to a second opening OP2 and may be electrically connected to the ground line GRL.

The first step difference compensation film SCF1 may include a second conductive film CF2-1 and a third conductive adhesive CA3-1. The first conductive adhesive film CAF1 may be electrically connected to the ground line GRL via the first step difference compensation film SCF1. Accordingly, the first heat dissipation sheet MS1 and the ground line GRL may be electrically connected to each other via the first conductive adhesive film CAF1 and the first step difference compensation film SCF1, and thus, the electrostatic path may be formed.

The second step difference compensation film SCF2 may include a second conductive film CF2-2 and a third conductive adhesive CA3-2. The second conductive adhesive film CAF2 may be electrically connected to the ground line GRL via the second step difference compensation film SCF2. Accordingly, the second heat dissipation sheet MS2 and the ground line GRL may be electrically connected to each other via the second conductive adhesive film CAF2 and the second step difference compensation film SCF2, and thus, the electrostatic path may be formed.

As the electrostatic path is provided to each of the first and second heat dissipation sheets MS1 and MS2 in the structure in which the first and second heat dissipation sheets MS1 and MS2 are spaced apart from each other, static electricity dissipation characteristics of the display device DD may be improved. In particular, since the first heat dissipation sheet MS1 is electrically separated from the second heat dissipation sheet MS2, damage to the driving chip DIC mounted on the display panel DP, due to the static electricity introduced through the second heat dissipation sheet MS2, may be reduced or effectively prevented.

Figure 8:
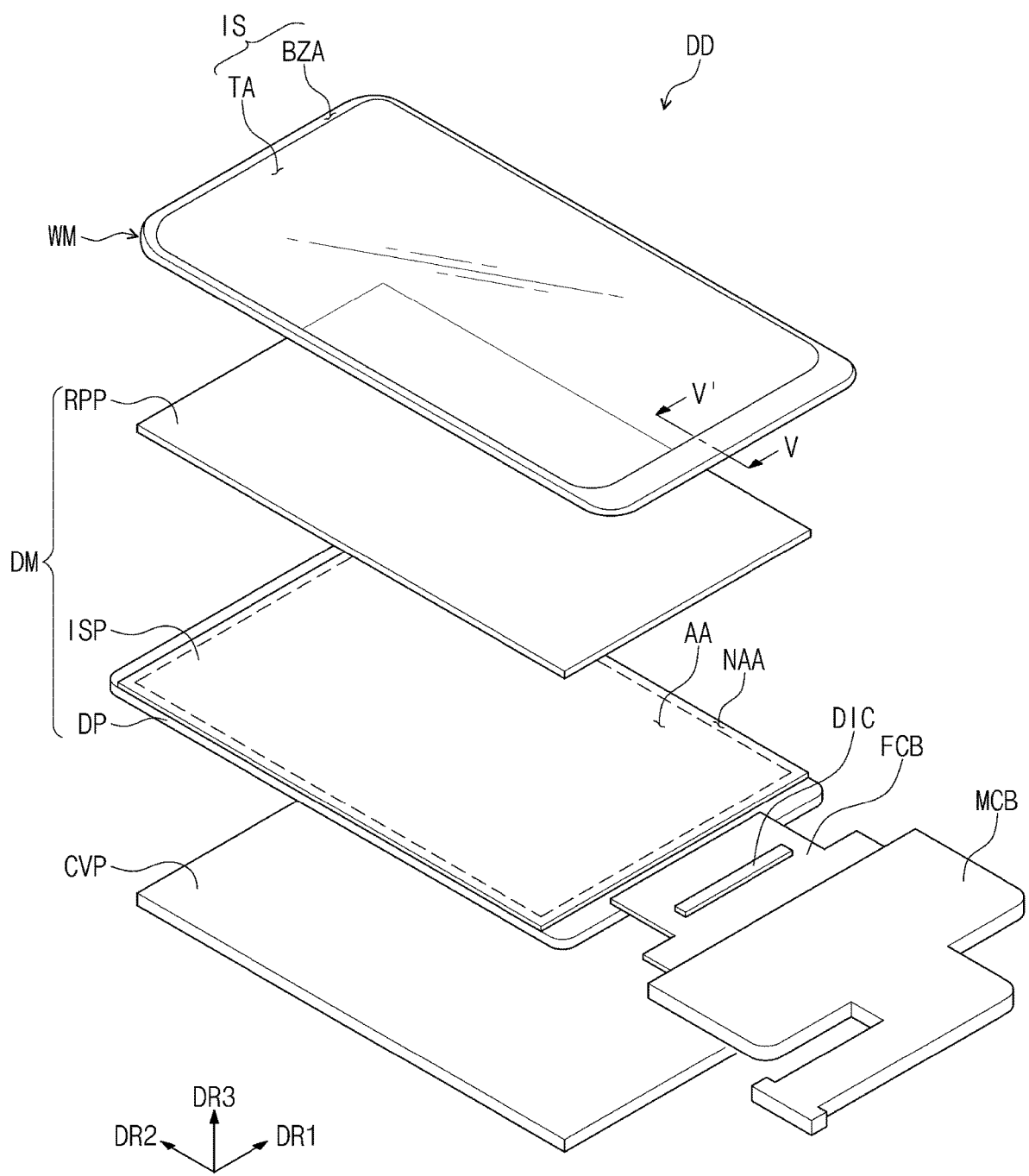
FIG. 8 is an exploded perspective view showing an embodiment of a display device.
Figure 9:
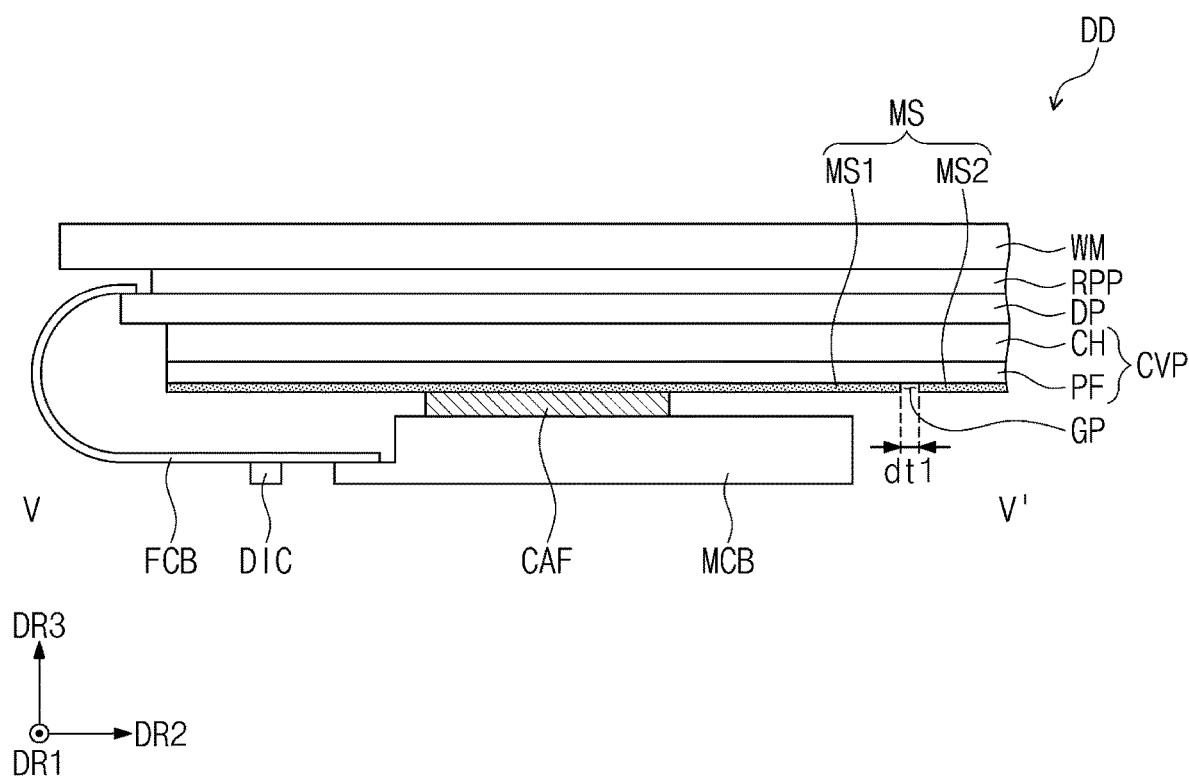
FIG. 9 is a cross-sectional view taken along line V-V' shown in FIG. 8.

FIG. 8 is an exploded perspective view showing an embodiment of a display device DD, and FIG. 9 is a cross-sectional view taken along line V-V' shown in FIG. 8. In FIG. 8, the same reference numerals denote the same elements in FIGS. 1B to 7B, and thus, detailed descriptions of the same elements will be omitted.

Referring to FIGS. 8 and 9, the display device DD may further include a flexible circuit film FCB disposed between a display panel DP and a circuit board MCB. The circuit board MCB may be electrically connected to the display panel DP via the flexible circuit film FCB. The flexible circuit film FCB may be connected to the display panel DP at a first end of the flexible circuit film FCB, and the flexible circuit film FCB may be connected to the circuit board MCB at a second end of the flexible circuit film FCB which is opposite to the first end thereof.

The display panel DP may be connected to the flexible circuit film FCB at a peripheral area NAA of the display panel DP, such as through a bonding process. A driving chip DIC may be mounted on the flexible circuit film FCB. The flexible circuit film FCB which is bent to surround a side surface of the display panel DP, the driving chip DIC and the circuit board MCB coupled to the flexible circuit film FCB, may be disposed on a rear surface of the display panel DP. The flexible circuit film FCB which is bent disposes the driving chip DIC and a portion of the flexible circuit film FCB facing a first heat dissipation sheet MS1.

An electrical connection relationship between the first heat dissipation sheet MS1 and the circuit board MCB is substantially the same as that described with reference to FIGS. 4A to 5B, and thus, details thereof will be omitted. In an embodiment, the electrical connection relationship between the heat dissipation layer MS and the circuit board MCB may be substantially the same as that described with reference to FIGS. 6A to 7B, and thus, details thereof will be omitted.

FIGS. 10A to 10D are cross-sectional views showing an embodiment of a manufacturing process of the display device DD.

Figure 10A:
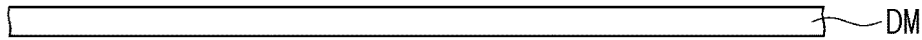
FIGS. 10A to 10D are cross-sectional views showing an embodiment of a manufacturing process of a display device.

Referring to FIG. 10A, the manufacturing process of the display device DD may include providing the display module DM described above, as a completed component. The display module DM which is completed may include the display panel DP (refer to FIG. 1B) and the input sensing unit ISP (refer to FIG. 1B). For the convenience of explanation, detailed configurations of the display module DM are omitted in FIG. 10A.

Figure 10B:
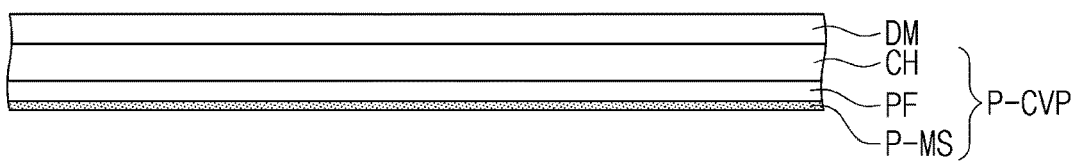

Referring to FIG. 10B, a preliminary cover panel P-CVP may be provided on the rear surface of the display module DM. The preliminary cover panel P-CVP may be coupled to the rear surface of the display module DM such as by the adhesive film.

The preliminary cover panel P-CVP may include a preliminary heat dissipation layer P-MS, the first layer PF and the second layer CH. The preliminary heat dissipation layer P-MS may be disposed on the rear surface of the first layer PF, and the second layer CH may be disposed on the front or upper surface of the first layer PF. The preliminary heat dissipation layer P-MS may include a metal material. In an embodiment, for example, the preliminary heat dissipation layer P-MS may include a metal material having high heat conductivity, such as copper (Cu), aluminum (Al), gold (Au) or the like.

The first layer PF may be a polyimide ("PI") film. An adhesive layer may be further disposed between the first layer PF and the preliminary heat dissipation layer P-MS. The second layer CH may be an impact absorbing layer. The second layer CH may be disposed between the display module DM and the first layer PF.

Figure 10C:
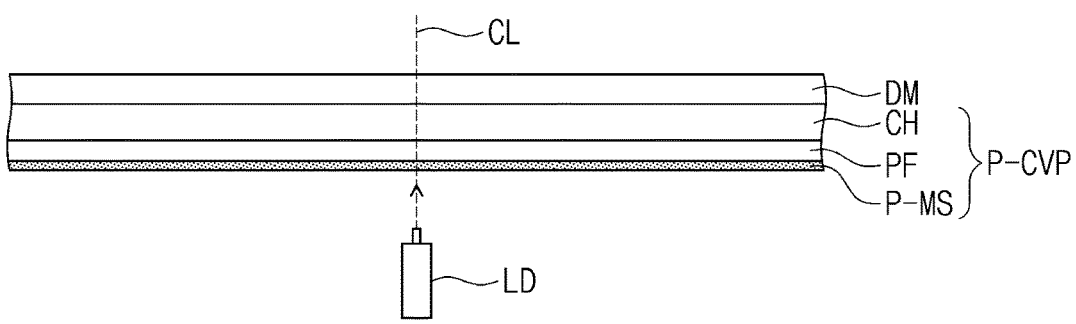

Referring to FIG. 10C, the manufacturing method of the display device DD may include removing a portion of the preliminary heat dissipation layer P-MS along a cutting line CL defined in the preliminary heat dissipation layer P-MS, such as by cutting in a cutting process. The cutting line CL may correspond to the gap GP between portions of the heat dissipation layer MS. The cutting process may include irradiating a laser beam along the cutting line CL. A laser unit LD may be disposed adjacent to a rear surface of the preliminary cover panel P-CVP and may irradiate the laser beam to the preliminary heat dissipation layer P-MS while moving along the cutting line CL.

Figure 10D:
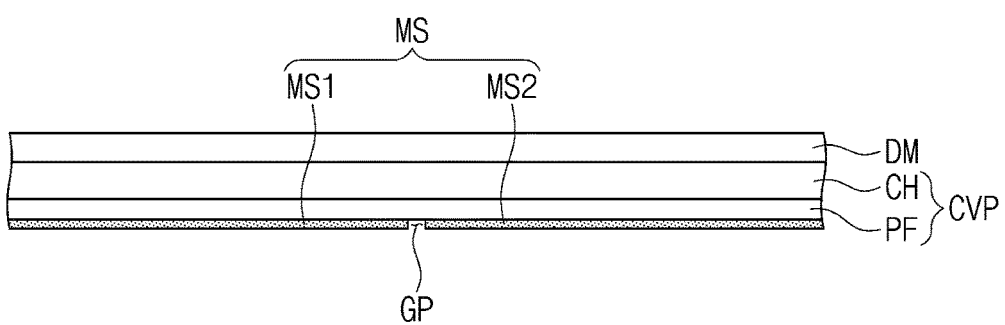

As shown in FIGS. 10C and 10D, the preliminary heat dissipation layer P-MS may be divided into the first heat dissipation sheet MS1 and the second heat dissipation sheet MS2, by the laser beam. Accordingly, the heat dissipation layer MS including the first heat dissipation sheet MS1 and the second heat dissipation sheet may be disposed within the cover panel CVP.

In FIGS. 10A to 10D, a method of irradiating the laser beam is described as a method of forming the first heat dissipation sheet MS1 and the second heat dissipation sheet MS2 from the preliminary heat dissipation layer P-MS, however, should not be limited thereto or thereby. In an embodiment, the first heat dissipation sheet MS1 and the second heat dissipation sheet MS2 are each manufactured as a separate sheet and respectively provided to the cover panel CVP, to omit the cutting process.

Although embodiments have been described, it is understood that the disclosure should not be limited to these embodiments but various changes and modifications can be made by one ordinary skilled in the art within the spirit and scope of the disclosure as hereinafter claimed. Therefore, the disclosed subject matter should not be limited to any single embodiment described herein, and the scope of the invention shall be determined according to the attached claims.

What is claimed is:

1. A display device comprising:
a display panel including a front surface at which an image is displayed and a rear surface which is opposite to the front surface;
a circuit board connected to the display panel and facing the rear surface of the display panel; and
a heat dissipation layer between the rear surface of the display panel and the circuit board, the heat dissipation layer comprising:
a first heat dissipation sheet electrically connected to the circuit board; and
a second heat dissipation sheet spaced apart from the first heat dissipation sheet in a direction along the display panel.

2. The display device of claim 1, wherein the first heat dissipation sheet is electrically insulated from the second heat dissipation sheet.

3. The display device of claim 1, wherein the circuit board faces the display panel with the first heat dissipation sheet therebetween.

4. The display device of claim 3, wherein
each of the first heat dissipation sheet and the circuit board has a planar shape, and
the planar shape of the first heat dissipation sheet corresponds to the planar shape of the circuit board.

5. The display device of claim 1, wherein
the display panel comprises a bending portion at which the display panel is bendable, and a flat portion which extends from the bending portion, and
the display panel which is bent at the bending portion disposes the bending portion to face the flat portion.

6. The display device of claim 5, further comprising a driving chip disposed on the bending portion of the display panel, and
the display panel which is bent at the bending portion disposes a portion of the bending portion and the driving chip each facing the first heat dissipation sheet.

7. The display device of claim 1, further comprising a flexible circuit film which is bendable and electrically connects the display panel and the circuit board to each other,
wherein the flexible circuit film includes a driving chip.

8. The display device of claim 7, wherein the driving chip is disposed on the flexible circuit film which is bent and faces the first heat dissipation sheet.

9. The display device of claim 1, wherein
the circuit board which faces the rear surface of the display panel comprises a ground line, and
the first heat dissipation sheet is electrically connected to the ground line of the circuit board.

10. The display device of claim 9, further comprising a conductive adhesive film which electrically connects the first heat dissipation sheet and the ground line of the circuit board to each other.

11. The display device of claim 10, wherein the circuit board comprises:
a cover layer between the ground line and the conductive adhesive film;
an opening which is defined through the cover layer and exposes a portion of the ground line to outside the cover layer to define an exposed portion of the ground line; and
a step difference compensation pattern which is in the opening and electrically connects the conductive adhesive film to the exposed portion of the ground line.

12. The display device of claim 11, wherein the step difference compensation pattern forms an interface with both the conductive adhesive film and the exposed portion of the ground line.

13. The display device of claim 9, further comprising:
a first conductive adhesive film which electrically connects the first heat dissipation sheet and the ground line of the circuit board to each other; and
a second conductive adhesive film which electrically connects the second heat dissipation sheet and the ground line of the circuit board to each other,
wherein the second heat dissipation sheet is electrically connected to the circuit board.

14. The display device of claim 13, wherein
the second heat dissipation sheet is spaced apart from the first heat dissipation sheet in the direction along the display panel, by a gap,
the first conductive adhesive film and the second conductive adhesive film are spaced apart from each other in the direction along the display panel, by the gap, and
the first conductive adhesive film faces the display panel with the first heat dissipation sheet therebetween, and the second conductive adhesive film faces the display panel with the second heat dissipation sheet therebetween.

15. The display device of claim 1, wherein the first heat dissipation sheet and the second heat dissipation sheet comprise a same metal material as each other.

16. The display device of claim 15, wherein the first heat dissipation sheet and the second heat dissipation sheet comprise copper.

17. The display device of claim 1, wherein the first heat dissipation sheet and the second heat dissipation sheet comprise different metal materials from each other.

18. The display device of claim 1, wherein
the first heat dissipation sheet and the second heat dissipation sheet each comprises a material having an electrical conductivity, and
the electrical conductivity of the material of the first heat dissipation sheet is higher than the electrical conductivity of the material of the second heat dissipation sheet.

19. The display device of claim 1, further comprising a cover panel between the display panel and the circuit board,
wherein the cover panel comprises:
the heat dissipation layer having the second heat dissipation sheet which is spaced apart from the first heat dissipation sheet in the direction along the display panel;
a first layer between the display panel and the heat dissipation layer; and
a second layer between the first layer and the display panel.

20. The display device of claim 19, wherein the second layer of the cover panel comprises:
an embossed layer comprising a plurality of protrusions protruding towards the display panel, and a cushion layer facing the display panel with the embossed layer therebetween.

\* \* \* \* \*